United States Patent
Chiang et al.

(10) Patent No.: US 9,501,088 B2
(45) Date of Patent: Nov. 22, 2016

(54) CLOCK GENERATOR, COMMUNICATION DEVICE AND SEQUENTIAL CLOCK GATING CIRCUIT

(71) Applicant: REALTEK SEMICONDUCTOR CORPORATION, Hsinchu (TW)

(72) Inventors: Chih-Jung Chiang, New Taipei (TW); Shun-Te Tseng, Hsinchu County (TW); Kai-Yin Liu, Hsinchu (TW); Jian-Ru Lin, Nantou County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 54 days.

(21) Appl. No.: 14/720,056

(22) Filed: May 22, 2015

(65) Prior Publication Data

US 2016/0004273 A1 Jan. 7, 2016

(30) Foreign Application Priority Data

Jul. 2, 2014 (TW) .............................. 103122921 A

(51) Int. Cl.
*G06F 1/10* (2006.01)
*G06F 1/08* (2006.01)

(52) U.S. Cl.
CPC .. *G06F 1/10* (2013.01); *G06F 1/08* (2013.01)

(58) Field of Classification Search
CPC .................................. G06F 1/10; H03L 7/105
See application file for complete search history.

(56) References Cited

U.S. PATENT DOCUMENTS

| | | | | |
|---|---|---|---|---|
| 4,208,724 A | * | 6/1980 | Rattlingourd | H04L 25/05 327/154 |
| 4,677,648 A | * | 6/1987 | Zurfluh | H03L 7/0814 327/159 |
| 4,841,551 A | * | 6/1989 | Avaneas | H04L 7/0338 178/70 R |
| 6,819,157 B2 | * | 11/2004 | Cao | H03L 7/0814 327/262 |
| 7,613,263 B2 | * | 11/2009 | Allen | H03L 7/00 375/355 |
| 8,786,333 B2 | | 7/2014 | Lin et al. | |

OTHER PUBLICATIONS

Office Action of the counterpart Taiwan patent application 103122921 mailed Jan. 29, 2016.
Search report of the counterpart Taiwan patent application 103122921 mailed Jan. 29, 2016.
English abstract translation of the Office Action of the counterpart Taiwan patent application 103122921 mailed Jan. 29, 2016.
Hoppner, Sebastian et al., "A power management architecture for fast per- core DVFS in heterogeneous MPSoCs" IEEE, May 2012.

(Continued)

*Primary Examiner* — Nitin Patel
(74) *Attorney, Agent, or Firm* — WPAT, P.C., Intellectual Property Attorneys; Anthony King

(57) ABSTRACT

The present invention discloses a clock generator comprising: an oscillator operable to generate a reference clock; a multi-phase clock generating circuit operable to generate a plurality of output clocks of the same frequency but different phases according to the reference clock and stop or start outputting the output clocks according to a power control signal; a sequential clock gating circuit operable to sequentially stop or start outputting a plurality of gated clocks according to a gate control signal and maintain an output cycle number relation between the gated clocks even though the multi-phase clock generating circuit stops and then starts outputting the output clocks; and a clock operation control circuit operable to provide the power control signal and the gate control signal.

20 Claims, 26 Drawing Sheets

100

(56) References Cited

OTHER PUBLICATIONS

Hoppner, Sebastian et al., "An open-loop clock generator for fast frequency scaling in 65nm CMOS technology", International Conference Mixed Design of Integrated Circuits and Systems, Jun. 16-18, 2011, Gilwice, Poland.

Bennett, Michael J., "An Overview of Energy-Efficient Ethernet", IEEE 802 Plenary, Mar. 2011.

* cited by examiner

CLOCK GENERATOR, COMMUNICATION DEVICE AND SEQUENTIAL CLOCK GATING CIRCUIT

BACKGROUND OF THE INVENTION

1. Field of the Invention

The present invention relates to clock generation, application and control, especially to a clock generator, a communication device and a sequential clock gating circuit capable of maintaining a cycle number relation between output clocks.

2. Description of Related Art

In a general Ethernet communication system, two link partners will act as a master and a slave respectively according to a predetermined rule. Each of the master and slave has a clock generator while the two clock generators work independently. As a result, their generated clocks have no constant correlation and usually differ from each other. However, in consideration of that the master and slave must be able to process signals from each other for communication, the clock generator of the slave should recover a master transmission clock according to a received master transmission signal, then generate a slave reception clock similar to or correlating with the master transmission clock, and then set a slave transmission clock in accordance with the slave reception clock; afterwards, the clock generator of the master should recover the slave transmission clock according to a received slave transmission signal, and then generate a master reception clock similar to or correlating with the slave transmission clock. Through the above operation, both parties are able to transmit and receive signals on the basis of a common clock.

Generally, during the process of generating the aforementioned slave or master reception clock, the slave or master will generate plural clocks of the same frequency but different phases through its clock generator, and then choose one of the plural clocks as the reception clock with a timing recovery technique. In order to save power, some Ethernet standard (e.g., IEEE 802.3az Energy Efficient Ethernet (EEE) standard) requires that the two link partners should turn off some heavily power-consuming component (e.g., some component of a physical layer circuit) when entering EEE mode without packet transmission/reception demands, and should come back to a normal mode from EEE mode within a predetermined time interval when detecting packet transmission/reception demands. The predetermined time interval is 20.5 μs for a device operating at 100 Megabit/s transmission rate, and 16.5 μs for a device operating at 1 Gigabit/s transmission rate.

In light of the above, regarding devices operating at 1 Gigabit/s transmission rate, the current Ethernet linking technique makes two link partners store the parameters about clock relation after establishing the link with appropriate clocks and makes the two link partners keep their clock generators working when entering EEE mode in order to comply with EEE standard, so that the two link partners will be able to leave EEE mode and come alive within the aforementioned predetermined time interval. However, the clock generator of an Ethernet device normally consumes a lot of power, so if the clock generator keeps working under EEE mode, the power-saving efficiency will be disappointed; but if the clock generator is turned off under EEE mode and turned on when leaving EEE mode, in view of that the clock generator may output wrong clocks (e.g., clock glitch) when being turned off and/or turned on or the clock relation may change after the clock generator restarted, the two link partners will need a lot of time to calibrate or rebuild the clock relation and therefore be unable to come back to normal operation within the said time interval of EEE standard.

Therefore, this industry needs a technique capable of tackling clock glitch and maintaining the relation between plural clocks when the clock generator generating the plural clocks is turned off and then turned on.

People who are interested in the prior art may refer to Applicant's US patent application with the application Ser. No. 13/793,604.

SUMMARY OF THE INVENTION

An object of the present invention is to make improvements over the prior art with a clock generator, a communication device and a sequential clock gating circuit.

Another object of the present invention is to provide a clock generator, a communication device and a sequential clock gating circuit operable to maintain a cycle number relation between output clocks after some or all of a multi-phase clock generating circuit is turned off and then turned on.

A further object of the present invention is to provide a clock generator, a communication device and a sequential clock gating circuit operable to turn off some or all of a clock generator while abiding by Energy Efficient Ethernet standard.

The present invention discloses a clock generator. An embodiment of the clock generator comprises: an oscillator operable to generate a reference clock; a multi-phase clock generating circuit, coupled to the oscillator, operable to generate a plurality of output clocks according to the reference clock, and operable to stop or start outputting the output clocks according to a power control signal in which the output clocks have the same frequency but different phases; a sequential clock gating circuit, coupled to the multi-phase clock generating circuit, operable to sequentially stop or start outputting a plurality of gated clocks according to a gate control signal and the plurality of output clocks, and operable to maintain an output cycle number relation between the gated clocks after the multi-phase clock generating circuit stopped and then starts outputting the output clocks; and a clock operation control circuit, coupled to the multi-phase clock generating circuit and the sequential clock gating circuit, operable to provide the power control signal and the gate control signal.

The present invention also discloses a communication device capable of temporarily turning off some or all of a multi-phase clock generating circuit after link establishment. An embodiment of the communication device comprises a clock generator, a transmission and reception clock generating circuit, a transmission circuit and a reception circuit. The said clock generator includes: an oscillator operable to generate a reference clock; the multi-phase clock generating circuit, coupled to the oscillator, operable to generate a plurality of output clocks according to the reference clock, and operable to stop or start outputting the output clocks according to a power control signal in which the output clocks have the same frequency but different phases; a sequential clock gating circuit, coupled to the multi-phase clock generating circuit, operable to sequentially stop or start outputting a plurality of gated clocks according to a gate control signal and the plurality of output clocks, and operable to maintain an output cycle number relation between the gated clocks after the multi-phase clock generating circuit stopped and then starts outputting the output clocks; and a clock operation control circuit, coupled to the multi-phase clock generating circuit and the sequential clock gating circuit, operable to provide the power control signal and the gate control signal. The said transmission and reception clock generating circuit is coupled to the clock generator and operable to generate at least one transmission clock and at least one reception clock according to at least one of the gated clocks. The said transmission circuit is operable to execute at least a transmission operation according to the at least one transmission clock. The said reception circuit is operable to execute at least a reception operation according to the at least one reception clock.

The present invention further discloses a sequential clock gating circuit capable of sequentially stopping and starting outputting a plurality of gated clocks. An embodiment of the sequential clock gating circuit comprises: a clock enablement aligning unit operable to generate an initial enablement signal according to a gate control signal and an aligning clock among plural clocks; a first gating unit, coupled to the clock enablement aligning unit, operable to generate a first gated clock among the gated clocks according to the initial enablement signal or the signal derived therefrom and according to a first clock among the plural clocks; and a second gating unit, coupled to the clock enablement aligning unit, operable to generate a second gated clock among the gated clocks according to the initial enablement signal or the signal derived therefrom and according to a second clock among the plural clocks, wherein the first and second clocks have the same frequency but different phases while an output cycle number relation between the first and second gated clocks is kept controlled after the level of the gate control signal has changed for plural times.

These and other objectives of the present invention will no doubt become obvious to those of ordinary skill in the art after reading the following detailed description of the preferred embodiments that are illustrated in the various figures and drawings.

BRIEF DESCRIPTION OF THE DRAWINGS

FIG. 7b illustrates a signal timing diagram of FIG. 7a.

FIG. 8b illustrates a signal timing diagram of FIG. 8a.

FIG. 8c illustrates an exemplary implementation of the sequential clock gating circuit of FIG. 8a.

FIG. 9b illustrates an exemplary implementation of the sequential clock gating circuit of FIG. 9a.

FIG. 9c illustrates a signal timing diagram of FIG. 9a.

FIG. 10b illustrates an exemplary implementation of the sequential clock gating circuit of FIG. 10a.

FIG. 10c illustrates a signal timing diagram of FIG. 10a.

DETAILED DESCRIPTION OF THE PREFERRED EMBODIMENTS

The following description is written by referring to terms acknowledged in this invention field. If any term is defined in the specification, such term should be explained accordingly. Besides, the connection between objects or events in the disclosed embodiments can be direct or indirect provided that these embodiments are still applicable under such connection. Said "indirect" means that an intermediate object or a physical space is existed between the objects, or an intermediate event or a time interval is existed between the events. In addition, the following description relates to clock generator, application and control and some part thereof that have been well known in this field will be omitted if such part have little to do with the features of the present invention. Furthermore, the shape, size, and ratio of any element and the step sequence of any flow chart in the disclosed figures are just exemplary for understanding, not limitations in the scope of this invention.

The present invention comprises a clock generator, a communication device including the clock generator, and a sequential clock gating circuit capable of being applied to the said clock generator and communication device. These devices are operable to maintain an output cycle number relation after restarting the output of plural clocks or after the level of a gate control signal has changed for several times, which thereby achieve the effect of returning to normal operation from power-saving operation rapidly. Provided that an alternative means is available and reasonable, people of ordinary skill in the art can use such means similar or equivalent to that described in this specification to carry out the present invention. Besides, the clock generator, communication device and sequential clock gating circuit of the present invention may comprise some well-known element, and the detail of such element may be omitted provided that this omission nowhere dissatisfies the disclosure and enablement requirements.

Figure 1:
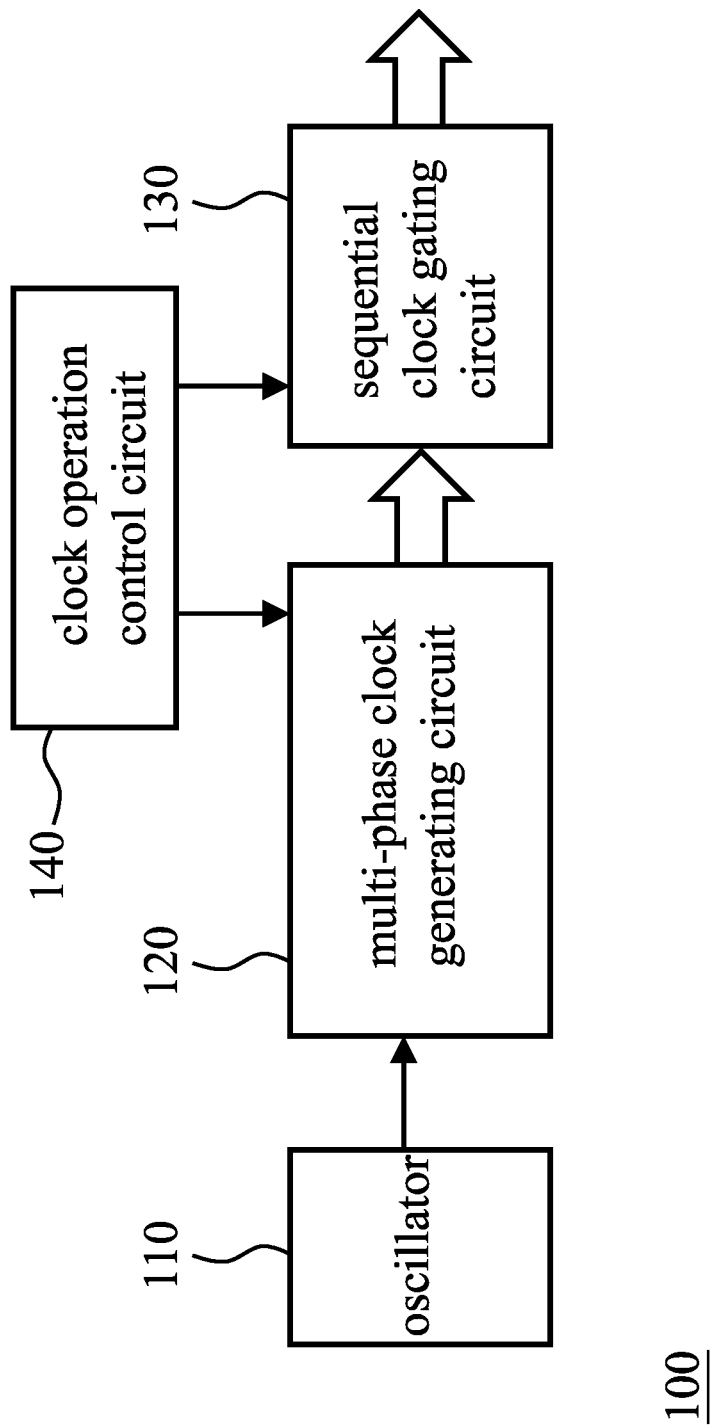
FIG. 1 illustrates an embodiment of the clock generator of the present invention.

Please refer to FIG. 1 which illustrates the clock generator of the present invention. This clock generator is capable of maintaining an output cycle number relation between gated clocks after a multi-phase clock generating circuit stopped and then starts outputting plural clocks. As it is shown in FIG. 1, the clock generator 100 comprises: an oscillator 110, a multi-phase clock generating circuit 120, a sequential clock gating circuit 130 and a clock operation control circuit 140. The said oscillator 110 such as a crystal oscillator or an element capable of generating a precise oscillation signal is operable to generate a reference clock. The said multi-phase clock generating circuit 120 is coupled to the oscillator 110 and operable to generate a plurality of output clocks having the same frequency but different phases according to the reference clock, and also operable to stop or start the operation of some of its circuit according to a power control signal to thereby realize the suspension of outputting the plurality of output clocks for power saving. The said sequential clock gating circuit 130 is coupled to the multi-phase clock generating circuit 120 and operable to sequentially stop or start outputting a plurality of gated clocks according to a gate control signal and the plurality of output clocks, and also operable to maintain an output cycle number relation between the gated clocks after the multi-phase clock generating circuit 120 stopped and then starts outputting the output clocks. For instance, to maintain the output cycle number relation could be to keep the output cycle number of one gated clock equal to the output cycle number of another gated clock, or to keep the difference between the output cycle numbers of two gated clocks constant, or to keep the relation between the number variations or variation rates of two gated clocks unchanged. In addition, the gate control signal could vary with the power control signal. For example, when the clock generator 100 has to be turned off, the gate control signal makes the sequential clock gating circuit 130 stop outputting the gated clocks by order and then the power control signal makes the multi-phase clock generating circuit 120 stop generating the output clocks; and when the clock generator 100 has to be turned on, the power control signal makes the multi-phase clock generating circuit 120 start generating the output clocks and after a while (e.g., a time interval such as a few micro seconds allowing the multi-phase clock generating circuit 120 to stably generate the output clocks) the gate control signal makes the sequential clock gating circuit 130 let the gated clocks go by order. The said clock operation control circuit 140 is coupled to the multi-phase clock generating circuit 120 and the sequential clock gating circuit 130 and operable to provide the mentioned power control signal and the gate control signal which could be signals derived from the mode switch command in compliance with Energy Efficient Ethernet (EEE).

Figure 2:
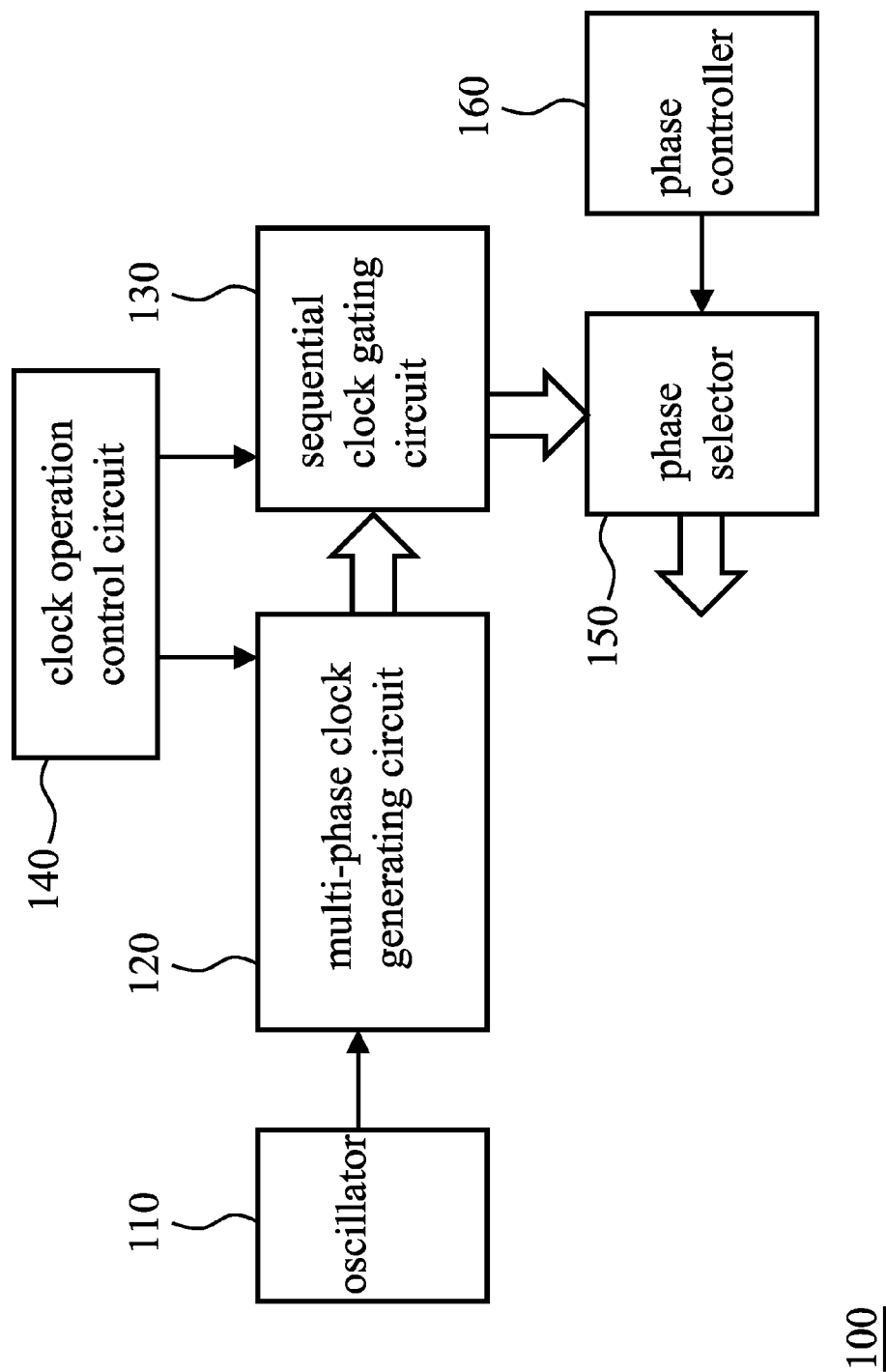
FIG. 2 illustrates an exemplary implementation of the clock generator of FIG. 1.

Please refer to FIG. 2. The clock generator 100 may further comprises: a phase selector 150 and a phase controller 160. The said phase selector 150 is coupled to the sequential clock gating circuit 130 and includes one or more phase selecting units (not shown). Each of the phase selecting units is operable to output one of the gated clocks for exploitation according to a phase control signal. For instance, the gated clock could be outputted as the transmission and/or reception clock(s) or the source clock(s) thereof for a slave in Ethernet communication, or outputted as the reception clock or the source clock thereof for a master in Ethernet communication. The said phase controller 160 is operable to provide the phase control signal according to a timing recovery result which could be generated by a timing recovery circuit in accordance with a reception signal such as a reception signal in Ethernet communication. People who are interested in timing recovery technique may refer to Applicant's Taiwan patent application with application Ser. No. 09/914,6590 or other published documents.

Figure 3:
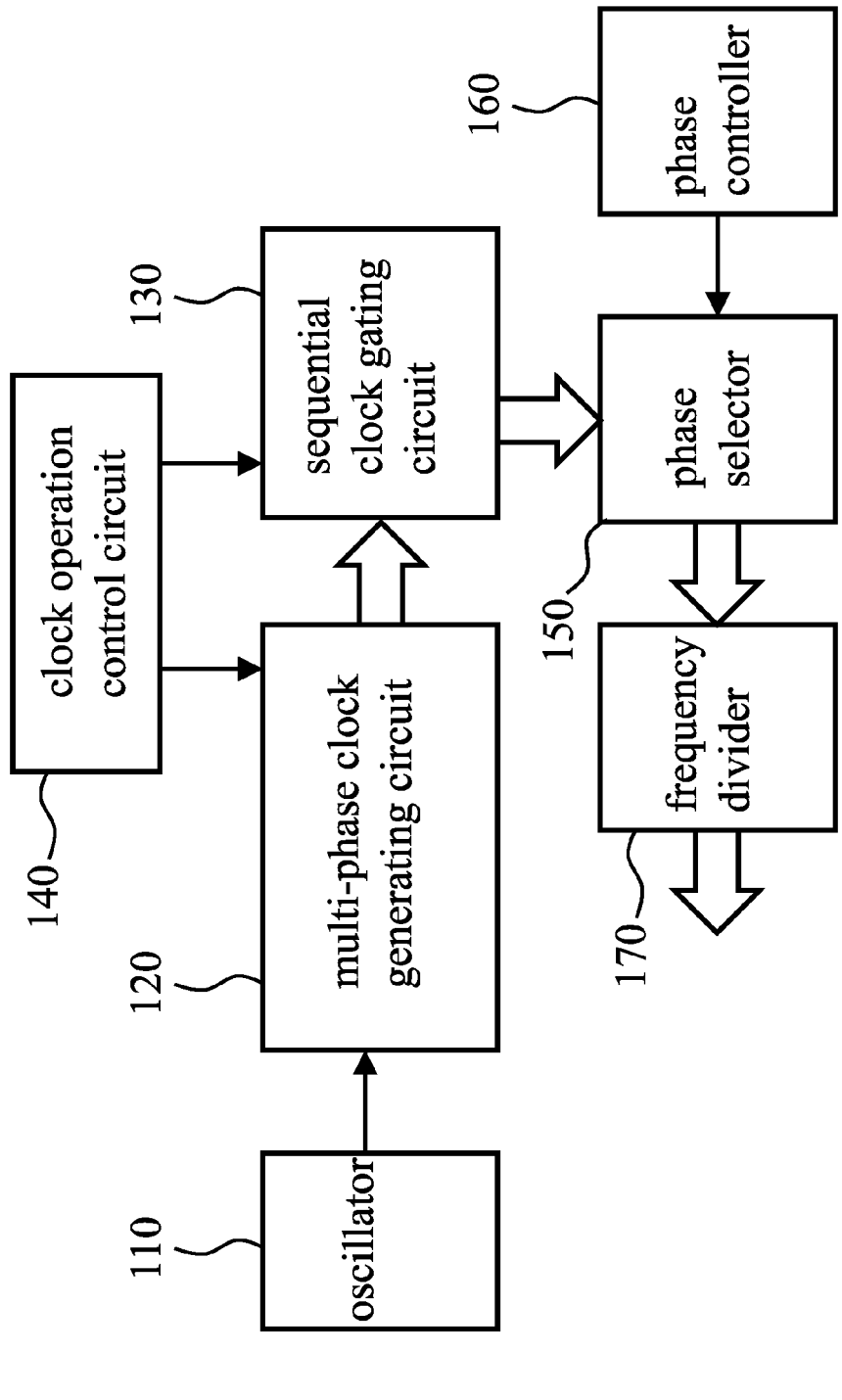
FIG. 3 illustrates an exemplary implementation of the clock generator of FIG. 2.

Please refer to FIG. 3. The clock generator 100 may further comprises: a frequency divider 170 including a plurality of frequency-dividing units (not shown) operable to carry out frequency division according to the gated clock(s) from the phase selecting units of the phase selector 150 of FIG. 2 and thereby generate a plurality of frequency-divided clocks for exploitation. For instance, the frequency-divided clocks could be treated as the transmission and/or reception clock(s) in Ethernet communication. Besides, the phase relation between these frequency-divided clocks can be kept control after the multi-phase clock generating circuit 120 stopped and then starts outputting the output clocks. More specifically, since the present invention is able to maintain the output cycle number relation between the gated clocks, the phase relation between the frequency-divided clocks that are generated by the frequency divider 170 in light of the gated clocks can therefore be maintained.

Figure 4:
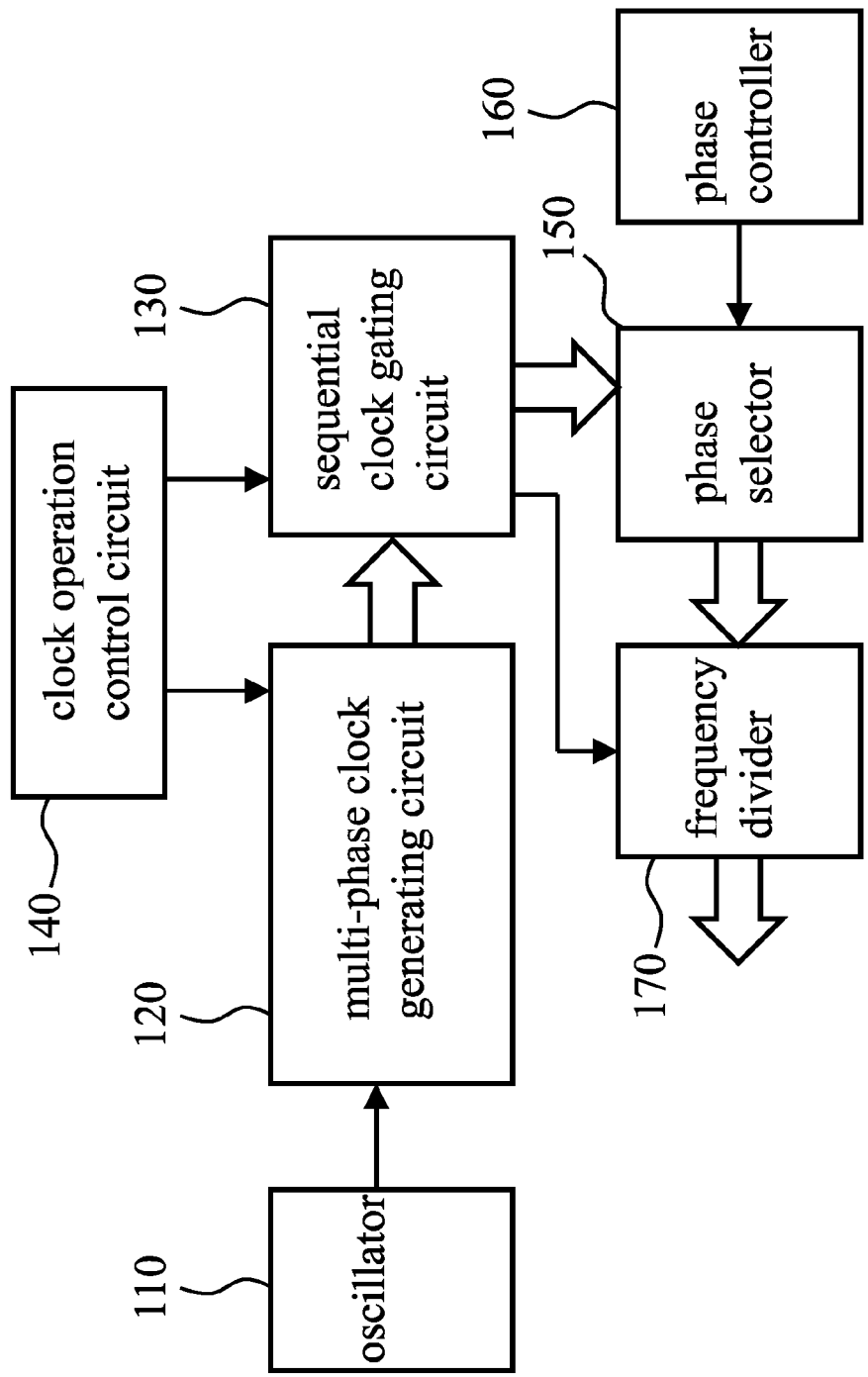
FIG. 4 illustrates another exemplary implementation of the clock generator of FIG. 2.

Please note that if the clock generator of the present invention is applied to an Ethernet device, provided that the Ethernet device acts as a master whose transmission clock will be the clock basis for two link partners, the gated clock(s) from the sequential clock gating circuit 130 or the frequency-divided clock(s) thereof can be treated as the transmission clock without doing phase selection. However, other transmission and reception clocks such as the transmission and reception clocks of a salve or the reception clock of the master in Ethernet communication are usually generated through phase selection, so that the correlation between these clocks and the transmission clock of the master can be kept controlled. More specifically, please refer to FIG. 4. The clock generator 100 may further comprise: a frequency divider 170 including a plurality of frequency-dividing units (not shown) coupled with the phase selector 150 and the sequential clock gating circuit 130, operable to carry out frequency division according to at least one gated clock from the phase selector 150 and at least one of the gated clocks from the sequential clock gating circuit 130 instead of the phase selector 150 and thus generate the plurality of frequency-divided clocks. Similarly, the phase relation between the frequency-divided clocks can be maintained after the multi-phase clock generating circuit 120 stopped and then starts generating the output clocks.

Figure 5:
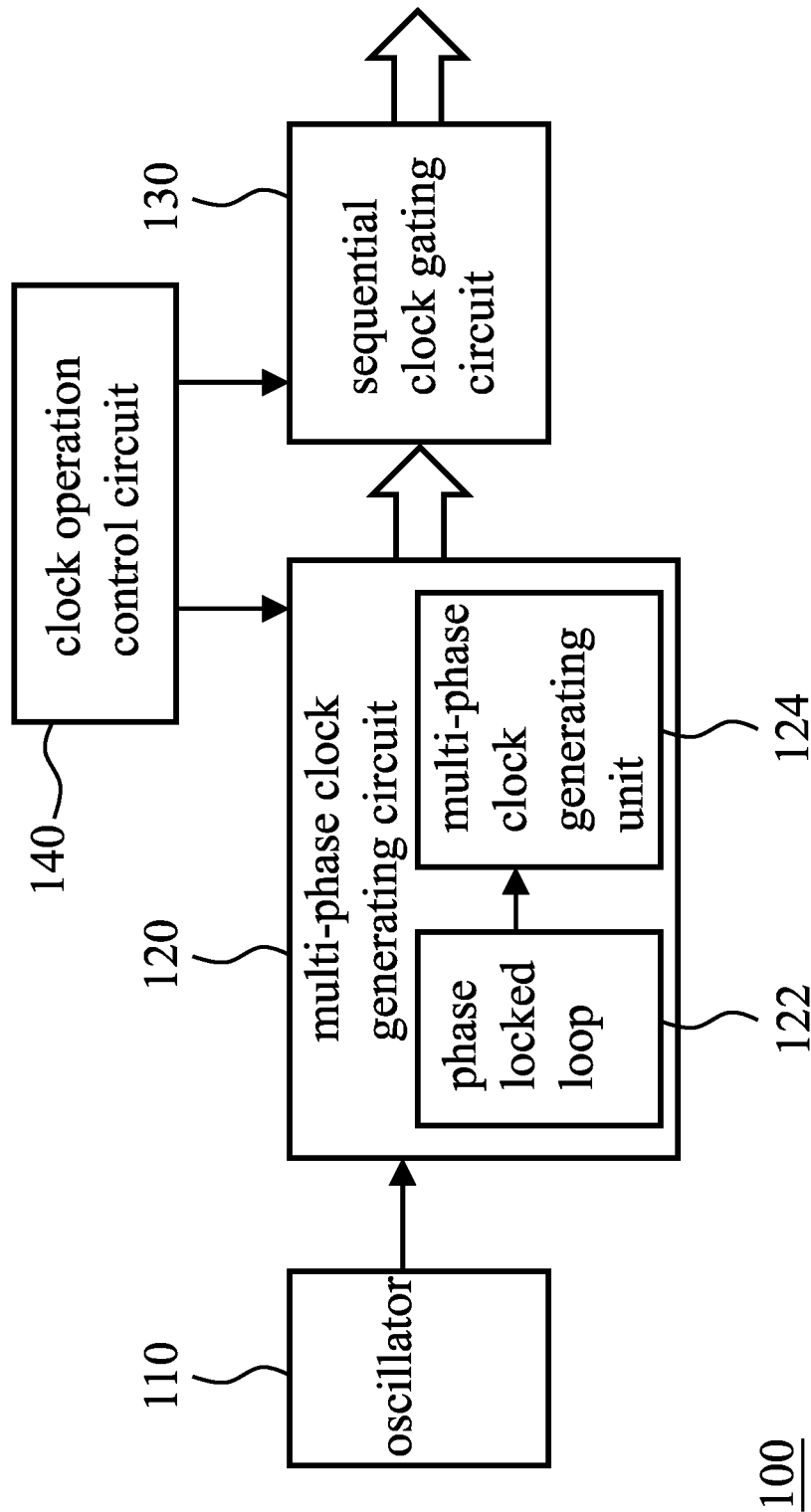
FIG. 5 illustrates an embodiment of the multi-phase clock generating circuit of FIG. 1.

Please refer to FIG. 5. An embodiment of the multi-phase clock generating circuit 120 includes: a phase locked loop 122, coupled to the oscillator 110, operable to generate an input clock according to the reference clock and operable to stop or start operating according to the power control signal for power saving; and a multi-phase clock generating unit 124, coupled to the phase locked loop 122, operable to generate the plurality of output clocks according to the input clock. Although this embodiment takes the phase locked loop 122 for example, this is not a limitation in the invention scope, which means that those of ordinary skill in the art may choose a known or self-developed multi-phase clock generating circuit (e.g., a pure multi-phase clock generating unit, a combination of an oscillator and a multi-phase clock generating unit, and etc.) in light of their demands to carry out the present invention.

Figure 6:
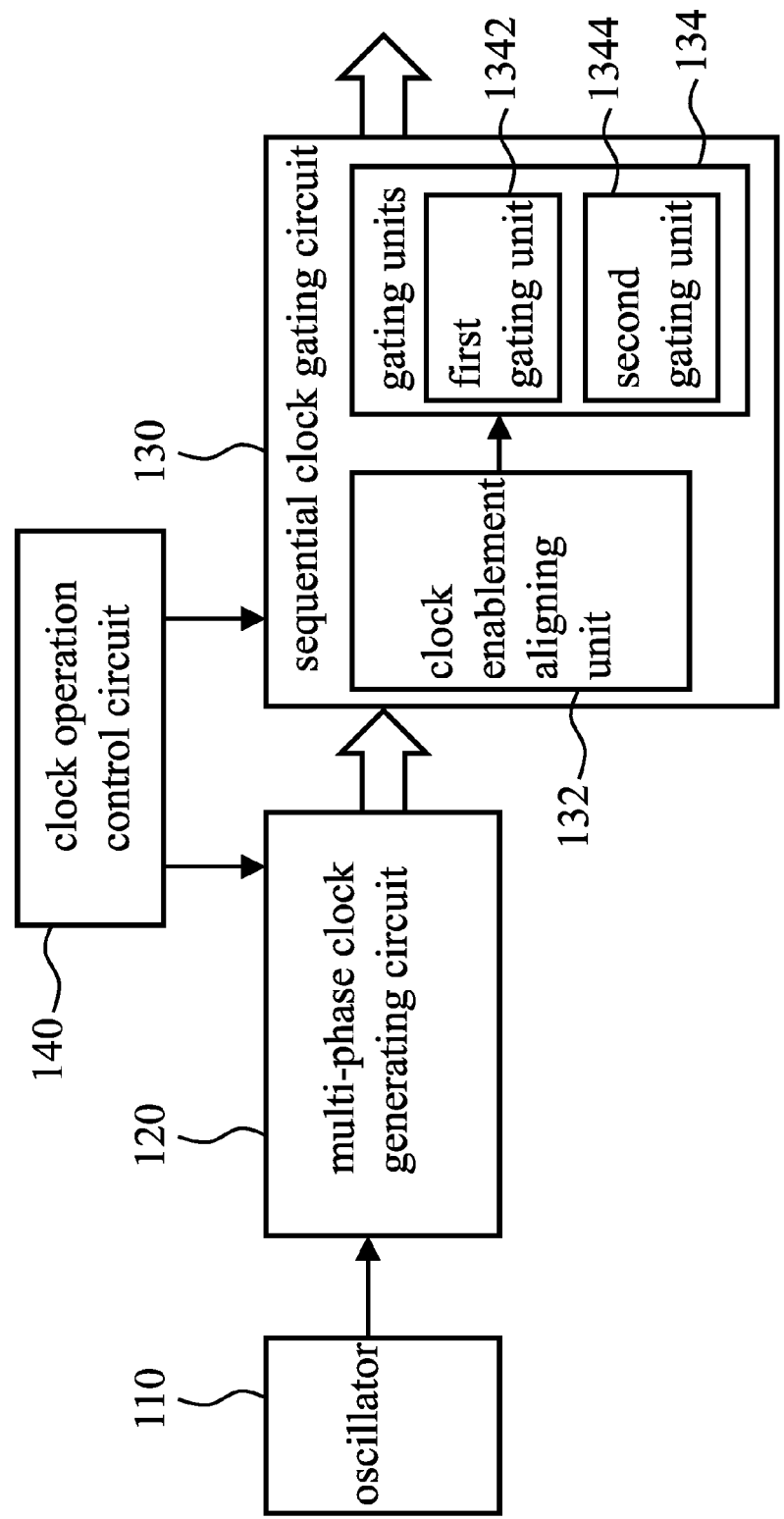
FIG. 6 illustrates an embodiment of the sequential clock gating circuit of FIG. 1.

Please refer to FIG. 6. An embodiment of the sequential clock gating circuit 130 includes: a clock enablement aligning unit 132, coupled to the clock operation control circuit 140 and the multi-phase clock generating circuit 120, operable to generate an initial enablement signal according to the gate control signal and one of the output clocks; and a plurality of gating units 134 operable to generate the plurality of gated clocks according to the initial enablement signal and the plurality of output clocks. For instance, the clock enablement aligning unit 132 is operable to make the level of the initial enablement signal reflect an enablement level as soon as the level of the gate control signal stays at the enablement level and the level of an aligning clock among the output clocks has changed. The level of the initial enablement signal may reflect the enablement level by changing from a non-enablement level to the enablement level or remaining at the enablement level, so that the plurality of gating units 134 can operate accordingly. More specifically, a first gating unit 1342 among the gating units 134 is operable to determine the level of a first gated clock among the gated clocks according to the level of the initial enablement signal or the signal derived therefrom and according to the level of a first clock among the output clocks, and a second gating unit 1344 among the gating units 134 is operable to determine the level of a second gated clock among the gated clocks according to the level of the initial enablement signal or the signal derived therefrom and according to the level of a second clock among the output clocks. Because both the first and second gating units 1342, 1344 operate by referring to the same initial enablement signal, the output cycle number relation between the first and second gated clocks can be kept controlled; in other words, the output cycle number of the first gated clock will vary with the output cycle number of the second gated clock.

Figure 7A:
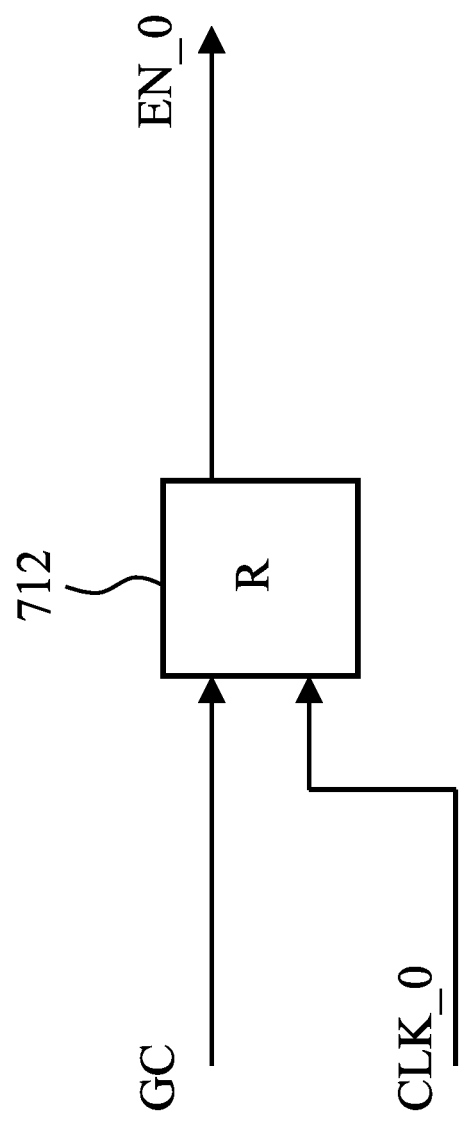
FIG. 7a illustrates an embodiment of the clock enablement aligning unit of FIG. 6.
Figure 7B:
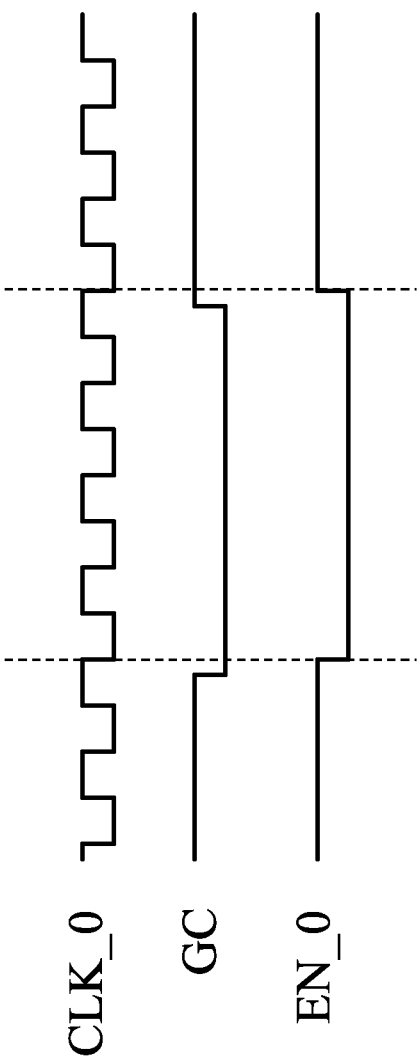
Figure 7C:
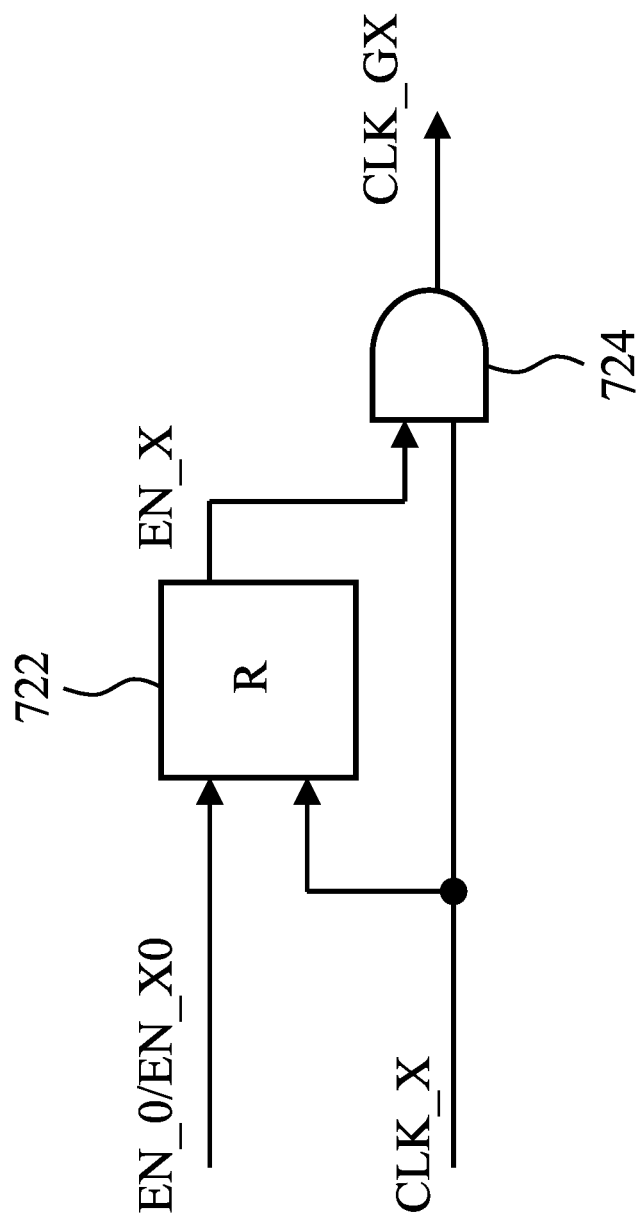
FIG. 7c illustrates an embodiment of the gating unit of FIG. 6.
Figure 7D:
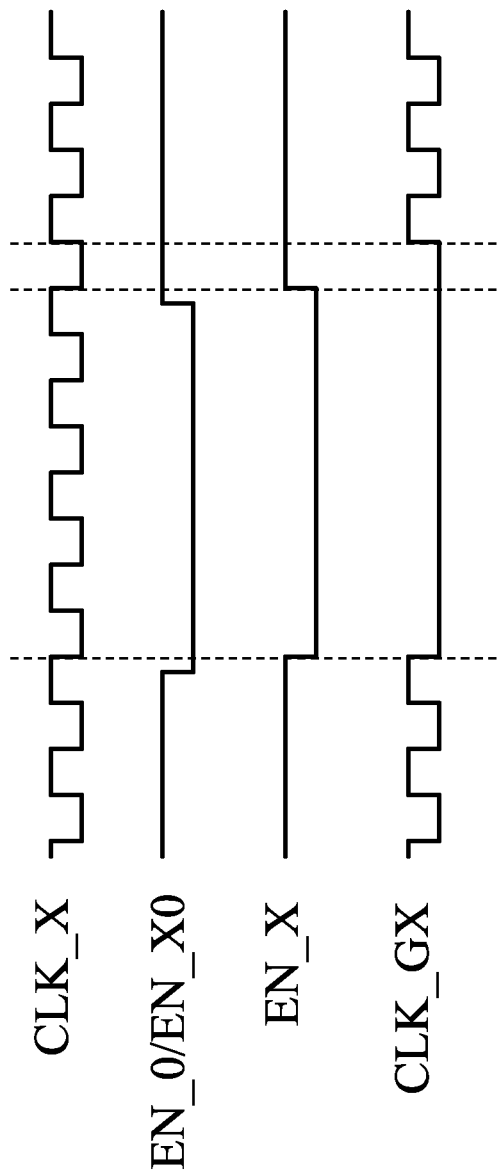
FIG. 7d illustrates a signal timing diagram of FIG. 7c.
Figure 7E:
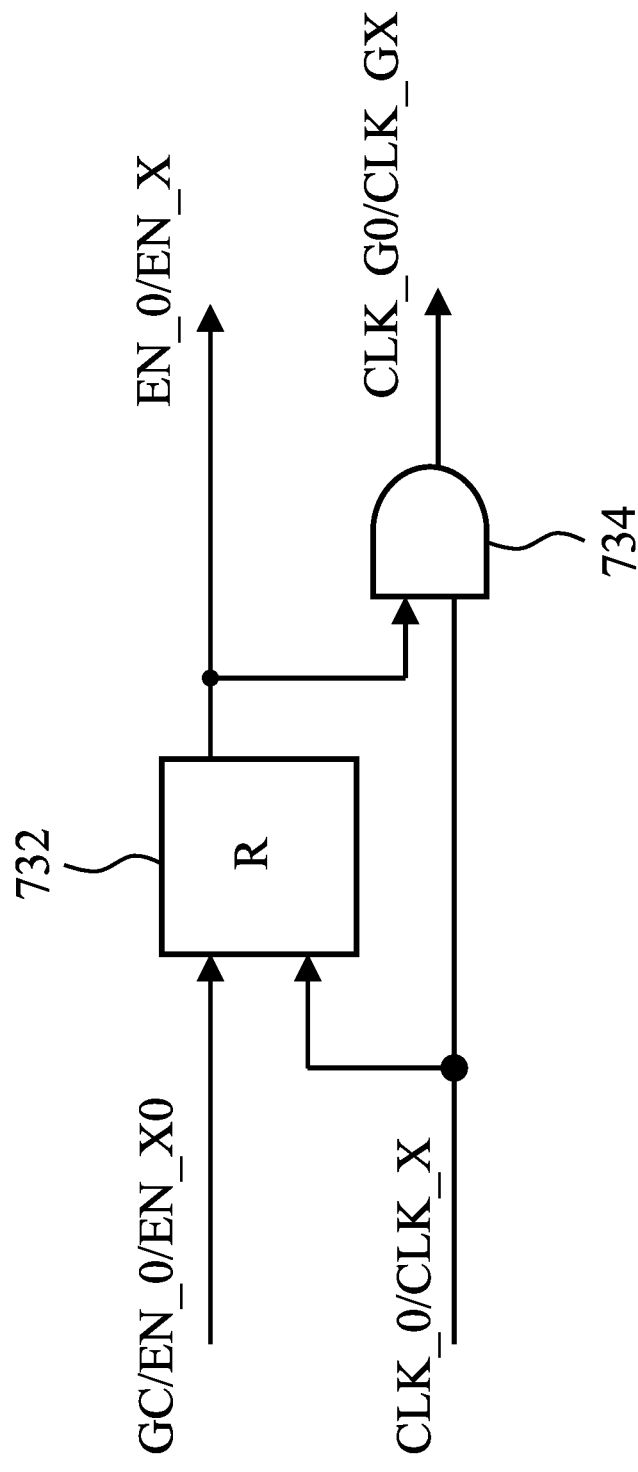
FIG. 7e illustrates an embodiment of the combination of the clock enablement aligning unit and the gating unit of FIG. 6.
Figure 7F:
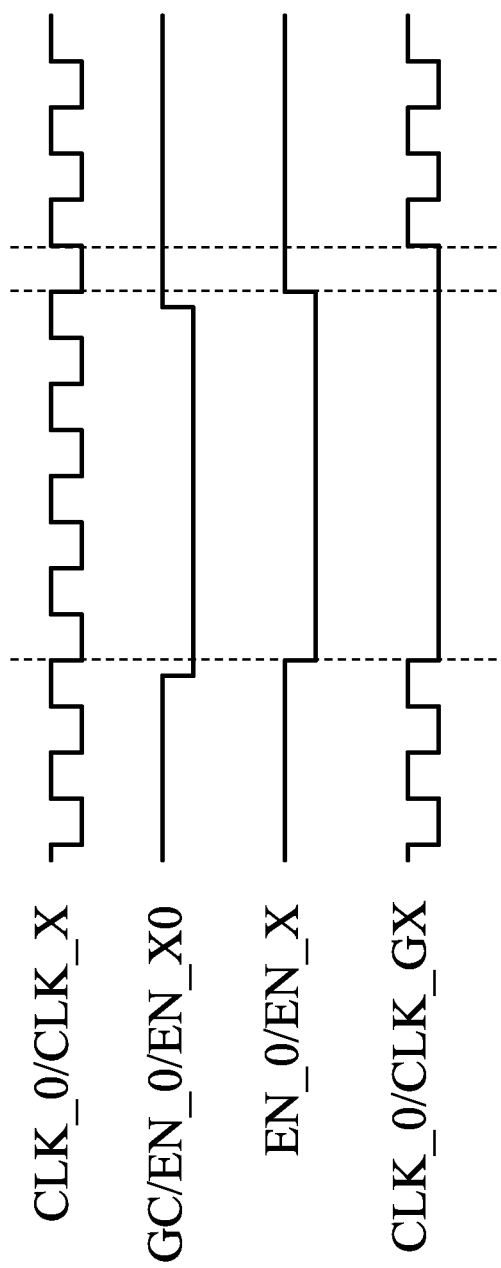
FIG. 7f illustrates a signal timing diagram of FIG. 7e.

Please refer to FIGS. 7*a*, 7*c* and 7*e* which illustrates the embodiments of the clock enablement aligning unit 132, the gating unit 134 and the combination thereof respectively. As it is shown in FIG. 7*a*, the clock enablement unit 132 includes a register (denoted with R) operable to generate the initial enablement signal (denoted with EN_0) according to the gate control signal (denoted with GC) and an aligning clock (denoted with CLK_0) among the output clocks. An example of the relation between these signals is illustrated in Table 1, and the timing diagram of these signals is shown in FIG. 7*b*. As it is shown in FIG. 7*c*, the gating unit 134 includes a register 722 and a logic gate 724. The register 722 is operable to generate a derived enablement signal (denoted with EN_X) according to the initial enablement signal (denoted with EN_0) or the derived signal thereof (denoted with EN_X0) and according to an output clock (denoted with CLK_X). The logic gate 724 is operable to generate a gated clock (denoted with CLK_GX) according to the derived enablement signal and the output clock. An example of the relation between these signals is illustrated in Table 2 and Table 3, and the timing diagram of these signals is shown in FIG. 7*d*. As it is shown in FIG. 7*e*, the combination of the clock enablement aligning unit 132 and the gating unit 134 includes a register 732 and a logic gate 734. The register 732 is operable to generate the initial enablement signal or the derived enablement signal according to one of the gate control signal, the initial enablement signal and the derived signal thereof (denoted with GC/EN_0/EN_X0) and according to one of the aligning clock and the output clocks (denoted with CLK_0/CLK_X). The logic gate 734 is operable to generate a gated clock (denoted with CLK_G0/CLK_X) according to the initial enablement signal (or the derived enablement signal) and the output clock. An example of the relation between these signals is illustrated in Table 4 and the timing diagram of these signals is shown in FIG. 7*f*. Please note that people of ordinary skill in the art may choose a known or self-developed element to realize the clock enablement aligning unit 132 and the gating unit 134 according to the signal relation as it is illustrated in Table 1 through Table 4 and the equivalent thereof. For instance, a latch, a flip-flop or the like can be used to implement the registers 712, 722, and a logic AND gate or its equivalent can be used to implement the logic gate 724. In other words, the implementations of FIG. 7*a* through FIG. 7*f* are exemplary for understanding the present invention, not limitations in the scope of the present invention. Please also note that in Table 1 through Table 4, although the enablement signal varies with the aligning clock or the falling edge (i.e., the edge of a level changing from 1 to 0) of the input clock, those of ordinary skill in the art can appreciate how to use the rising edge (i.e., the edge of a level changing from 0 to 1) instead as the trigger for variation of the enablement signal based on the disclosure of this specification.

TABLE 1

| gate control signal (GC) | aligning clock (CLK_0) | initial enablement signal (EN_0) |
|---|---|---|
| 1 | 0 → 1 | last state |
| 1 | 1 → 0 | 1 |
| 0 | 0 → 1 | last state |
| 0 | 1 → 0 | 0 |

TABLE 2

| initial enablement signal or the derived signal thereof (EN_0/EN_X0) | input clock (CLK_X) | derived enablement signal (EN_X) | gated clock (CLK_GX) |
|---|---|---|---|
| 1 | 0 → 1 | last state | CLK_X (when EN_X = 1) or 0 (when EN_X = 0) |
| 1 | 1 → 0 | 1 | CLK_X |
| 0 | 0 → 1 | last state | CLK_X (when EN_X = 1) or 0 (when EN_X = 0) |
| 0 | 1 → 0 | 0 | 0 |

TABLE 3

| derived enablement signal (EN_X) | gated clock (CLK_GX) |
|---|---|
| 0 | 0 |
| 1 | CLK_X |

TABLE 4

| GC/EN_0/EN_X0 | CLK_0/CLK_X | EN_0/EN_X | CLK_G0/CLK_GX |
|---|---|---|---|
| 1 | 0 → 1 | last state | CLK_X (when EN_X = 1) or 0 (when EN_X = 0) |
| 1 | 1 → 0 | 1 | CLK_X |
| 0 | 0 → 1 | last state | CLK_X (when EN_X = 1) or 0 (when EN_X = 0) |
| 0 | 1 → 0 | 0 | 0 |

Figure 8A:
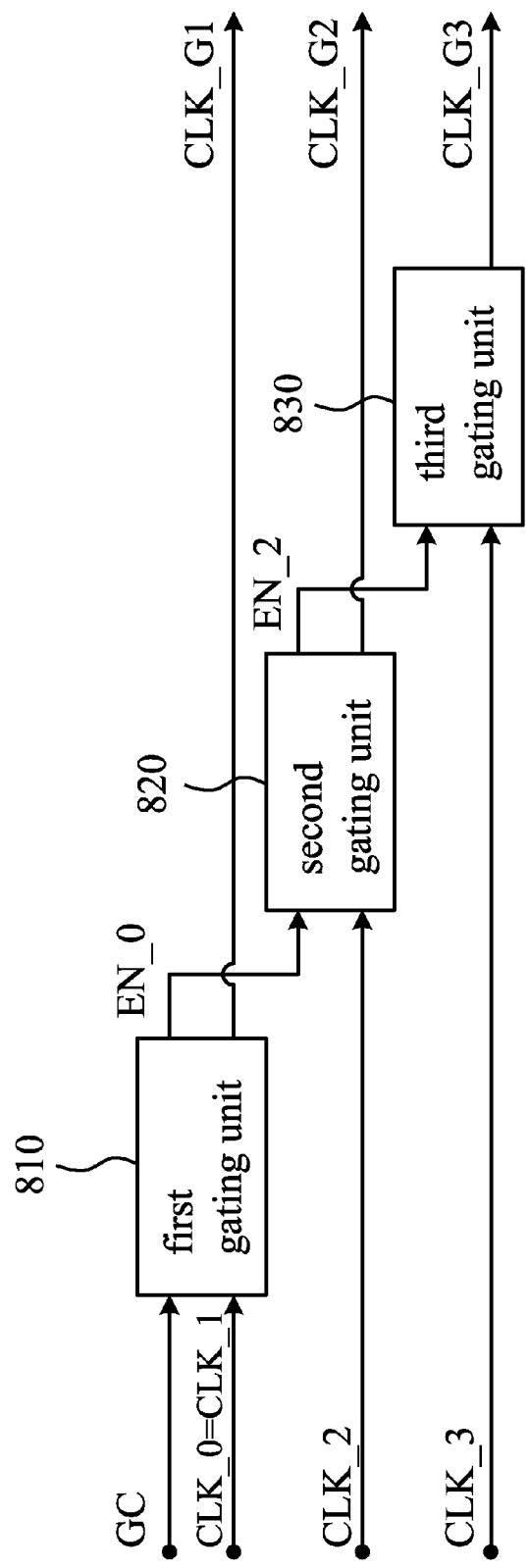
FIG. 8a illustrates an implementation example of the sequential clock gating circuit of FIG. 6.
Figure 8B:
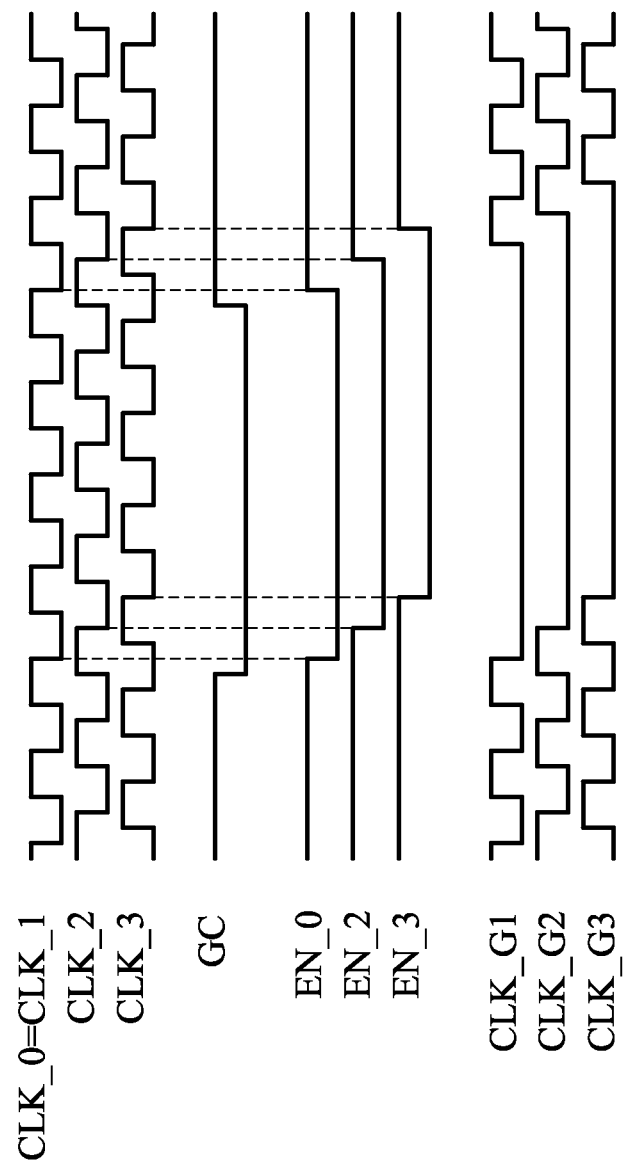
Figure 8C:
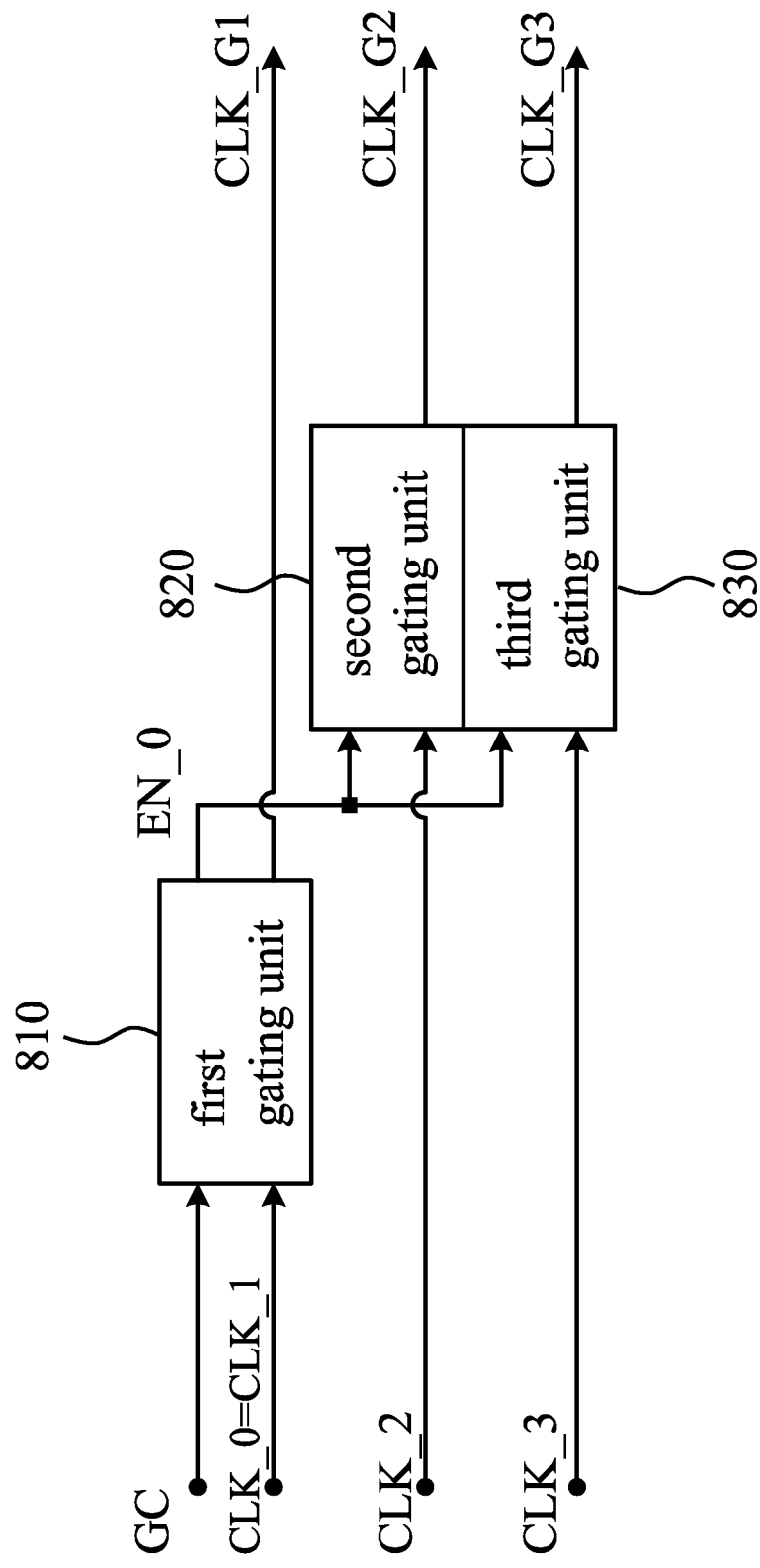

In order to make the present invention more understandable, several exemplary implementations of the sequential clock gating circuit 130 of FIG. 6 are given below. Please refer to FIG. 8*a*, the sequential clock gating circuit 130 includes: a first gating unit 810, a second gating unit 820 and a third gating unit 830. An embodiment of the first gating unit 810 is shown in FIG. 7*e*, including the combination of the clock enablement aligning unit and the gating unit (e.g., the logic gate 724 of FIG. 7*c*) operable to generate the initial enablement signal (denoted with EN_0) according to the gate control signal (denoted with GC) and an aligning clock (denoted with CLK_0) among the plural output clocks and then generate a first gated clock (denoted with CLK_G1) according to the initial enablement signal and a first clock (denoted with CLK_1) among the plural output clocks, wherein the aligning clock here is the first clock but could be some other output clock in an alternative embodiment. An embodiment of the second gating unit 820 is also shown in FIG. 7e, operable to generate a second derived enablement signal (denoted with EN_2) according to the initial enablement signal and a second clock (denoted with CLK_2) among the output clocks and then generate a second gated clock (denoted with CLK_G2) according to the second derived enablement signal and the second clock. An embodiment of the third gating unit 830 could be in the configuration of FIG. 7c, operable to generate a third gated clock (denoted with CLK_G3) according to the second derived enablement signal and a third clock (denoted with CLK_3) among the output clocks, wherein the first, second and third clocks have the same frequency but different phases, and the relation between the output cycle numbers of the first, second and third gated clocks can be kept controlled after the level of the gate control signal has changed for at least two times. The timing diagram of the above-mentioned signals is shown in FIG. 8b in which the level variation of the gate control signal reflects the multi-phase clock generating circuit 120 stopping and then starting outputting clocks, that is to say the level variation of the power control signal. In addition, the configuration of FIG. 8a is merely exemplary, and those of ordinary skill in the art may make proper alteration according to the disclosure of this specification. For instance, the configuration of FIG. 8a may be altered to be the configuration of FIG. 8c, wherein the second and third gating units 820, 830 can be realized in the configuration of FIG. 7c and both can operate according to the initial enablement signal while the output of the derived enablement signal is no longer necessary. Please note that since two gating units are enough to fulfill the characteristic of the present invention (i.e., keeping the output cycle number relation between plural clocks under control), the aforementioned third gating unit 830 is not a must for realizing the sequential clock gating circuit 130. Please also note that the implementation with more gating units could be derived from the above teaching.

Figure 9A:
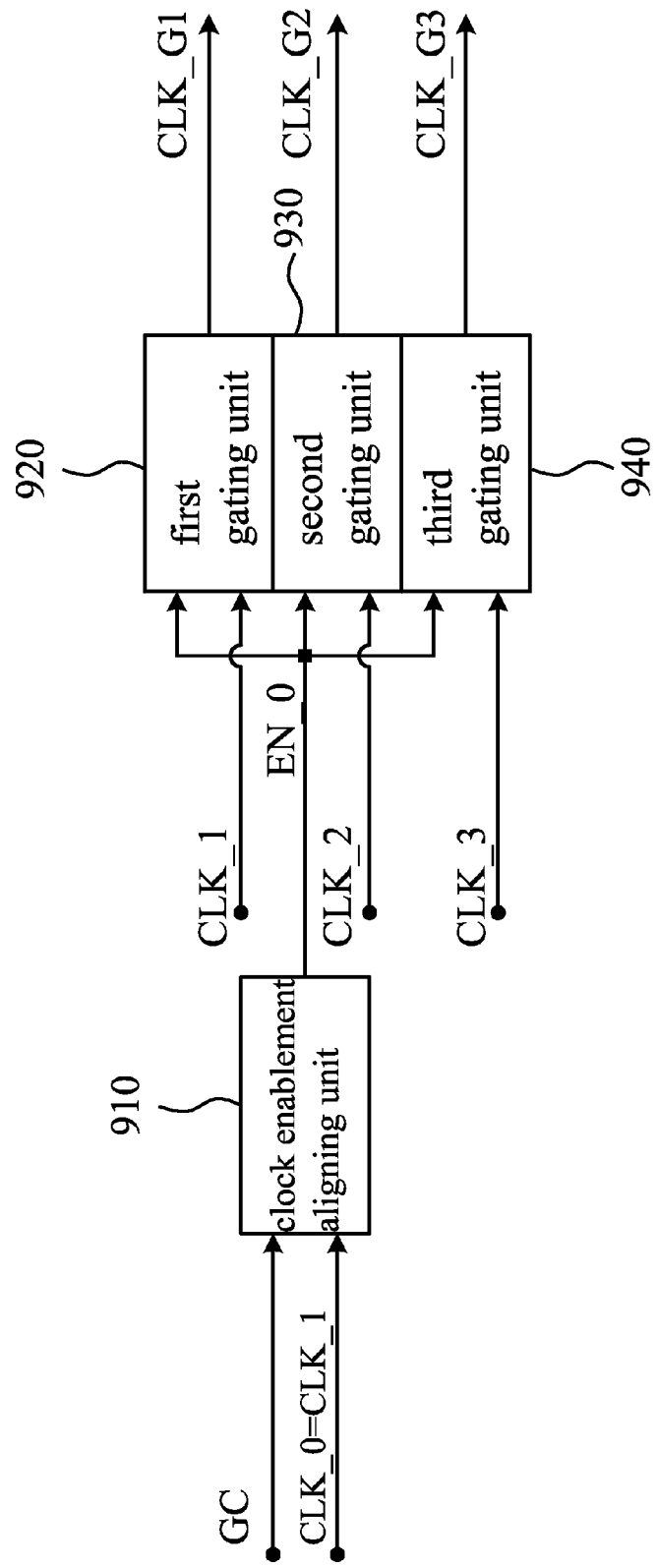
FIG. 9a illustrates another implementation example of the sequential clock gating circuit of FIG. 6.
Figure 9B:
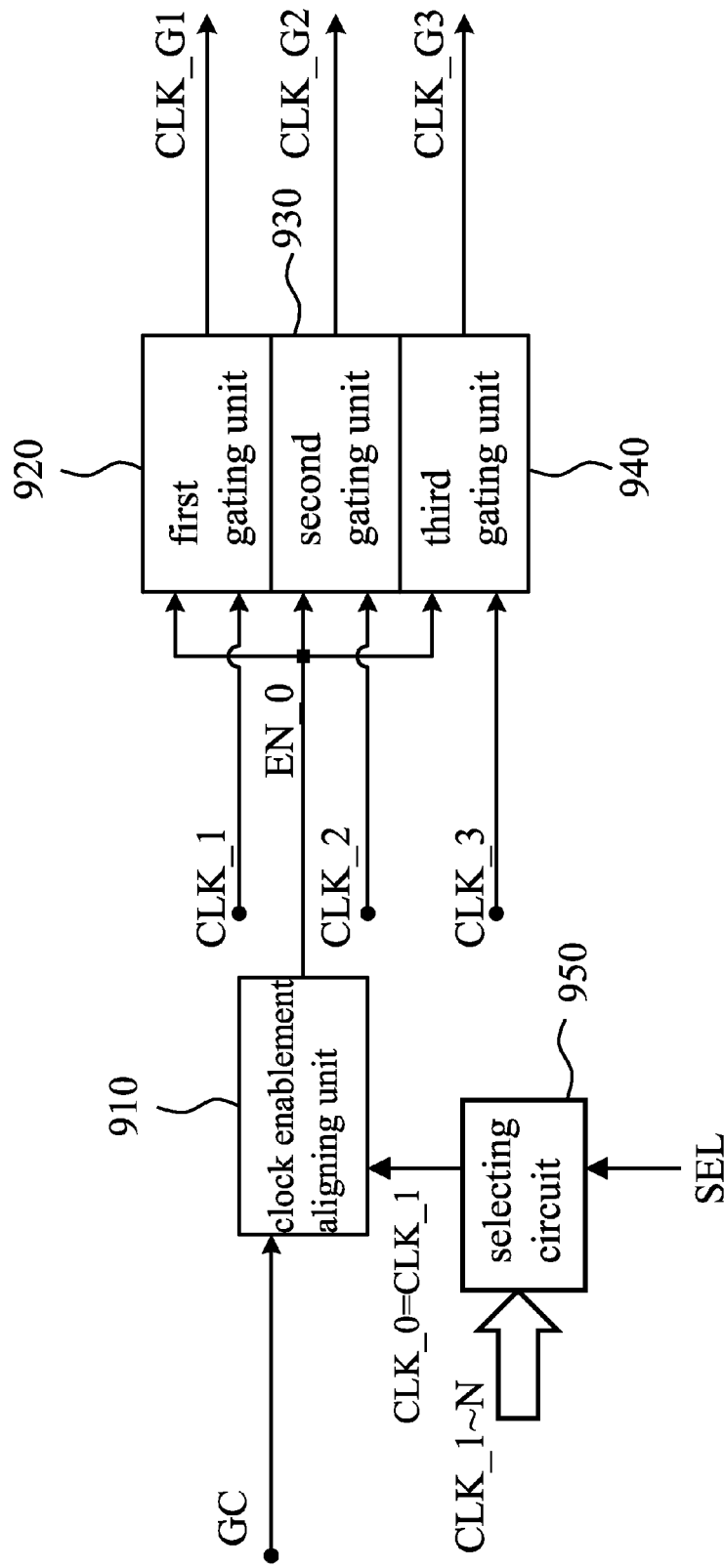
Figure 9C:
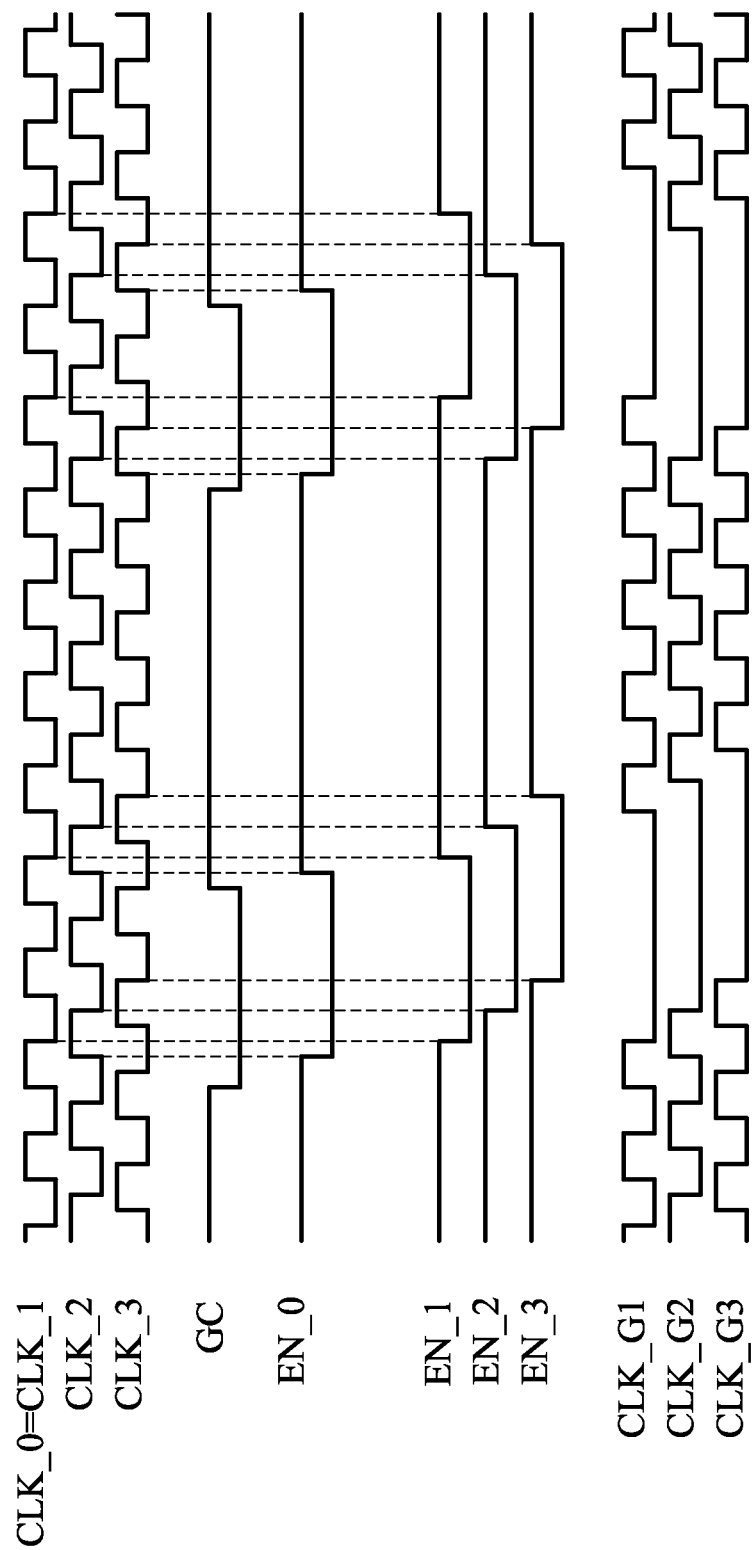

Next please refer to FIG. 9a. In this case the sequential clock gating circuit 130 includes: a clock enablement aligning unit 910, a first gating unit 920, a second gating unit 930 and a third gating unit 940. An embodiment of the clock enablement aligning unit 910 is shown in FIG. 7a, operable to generate the initial enablement signal according to the gate control signal and the aligning clock which is the first clock here but could be some other output clock in an alternative embodiment. For instance, as it is shown in FIG. 9b, a selecting circuit 950 is operable to output one of the plural output clocks (denoted with CLK_1~N) as the aligning clock according to a selection signal (denoted with SEL) which could be freely determined by those carrying out the present embodiment. Besides, the first, second and third gating units 920, 930, 940 could be realized in the configuration of FIG. 7c, operable to generate the first, second and third gated clocks respectively according to the first, second and third clocks and the first, second and third derived enablement signals (denoted with EN_1, EN_2, EN_3) under the control of the initial enablement signal. The timing diagram of these signals is shown in FIG. 9c. As it is described in the preceding paragraph, since two gating units are enough to fulfill the characteristic of the present invention, the third gating unit 940 is not a must for realizing the sequential clock gating circuit 130; besides, the implementation with more gating units could be derived from the above teaching.

Figure 10A:
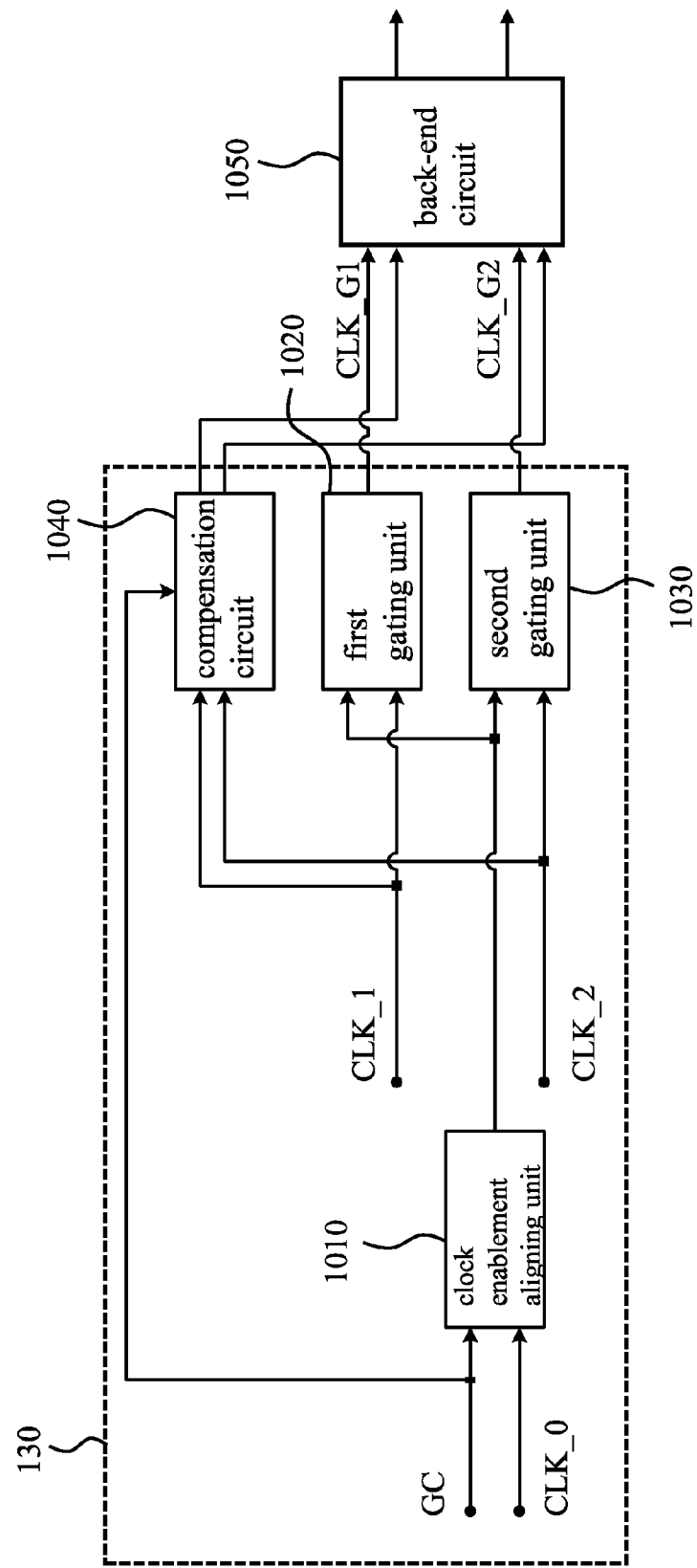
FIG. 10a illustrates a further implementation example of the sequential clock gating circuit of FIG. 6.
Figure 10B:
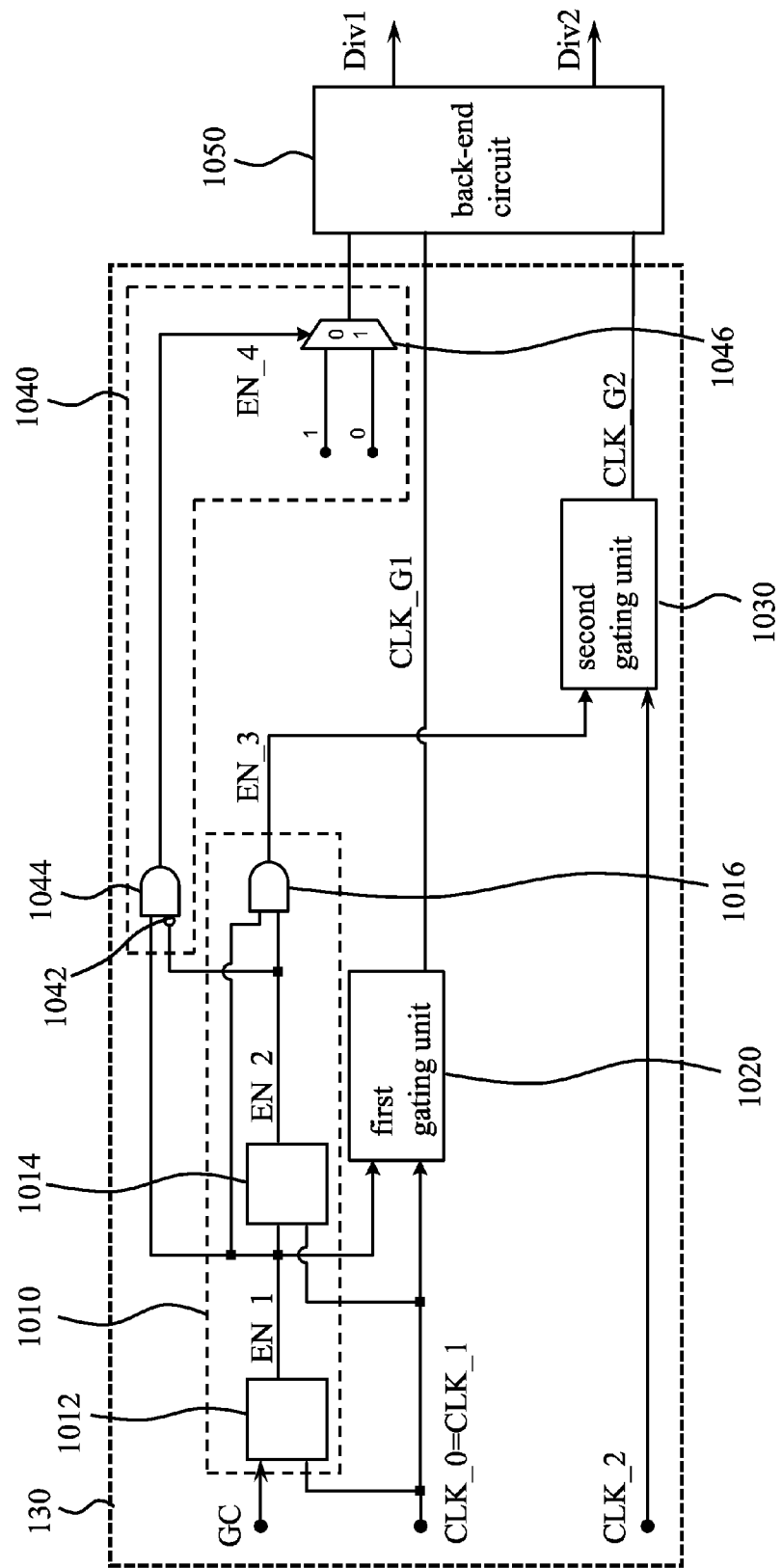
Figure 10C:
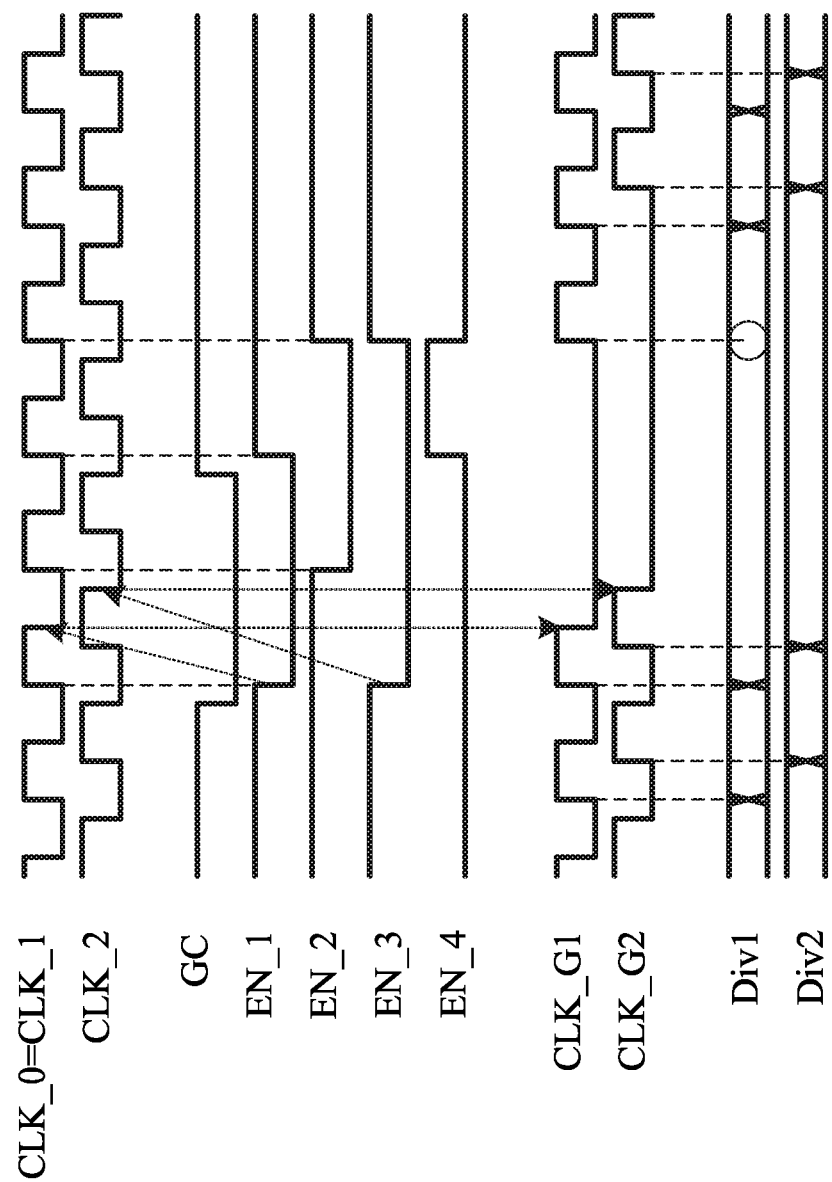

As it is mentioned in the preceding paragraph, to maintain the output cycle number relation could be to keep the output cycle number of one gated clock equal to the output cycle number of another gated clock, or to keep the difference between the output cycle numbers of two gated clocks constant, or to keep the relation between the number variations or variation rates of two gated clocks unchanged. In order to satisfy different design requirements or increase design flexibility, as it is shown in FIG. 10a, the sequential clock gating circuit 130 not only includes the clock enablement aligning unit 1010, a first gating unit 1020 and a second gating unit 1030, but also includes a compensation circuit 1040 that is operable to output a compensation signal according to the gate control signal and at least one of the plural output clocks (i.e., the first and second clocks in this case), so that a back-end circuit 1050 (e.g., a frequency divider) is allowed to output a first processed signal and a second processed signal according to the compensation signal and the first and second gated clocks, wherein an output cycle number relation between the first and second processed signals is kept controlled after the level of the gate control signal has changed for plural times. For instance, as it is shown in FIG. 10b, the clock enablement aligning unit 1010 includes a first aligning unit 1012 operable to output a first enablement signal (denoted with EN_1), a second aligning unit 1014 operable to output a second enablement signal (denoted with EN_2) and a logic AND gate 1016 operable to output a third enablement signal (denoted with EN_3) in which the embodiments of the first and second aligning units 1012, 1014 are shown in FIG. 7a, the embodiments of the first and second gating units 1020, 1030 are shown in FIG. 7c, the compensation circuit 1040 includes an INVERSE gate 1042 operable to output the inverse signal of the second enablement signal, a logic AND gate 1044 operable to output a fourth enablement signal (denoted with EN_4) and a multiplexer 1046 operable to output the said compensation signal to the back-end circuit 1050. Accordingly, the back-end circuit 1050 is able to output the first and second processed signal (denoted with Div1, Div2) whose output cycle number relation conforms to the predetermined setting. The timing diagram of these signals is shown in FIG. 10c. In consideration of that the operation of each element and the connection between these elements have been well explained, people of ordinary skill in the art can appreciate and execute the compensation function of the sequential clock gating circuit 130 according to the explanation, and are allowed to design their wanted compensation function through the use of delay element, triggering element, aligning element, logic element, selecting element and etc. and the layout of circuit connection; in the meantime, repeated and redundant description is omitted.

In light of the above, the clock generator 100 is capable of outputting the plurality of gated clocks within a predetermined time interval since the clock generator 100 received the power control signal which asks for the output of the plural output clocks during the suspension of outputting the plural output clocks. The predetermined time interval, for example, could be a time interval necessary for an Ethernet device equipped with the clock generator 100 to return to normal while the time interval is not more than 16.5 μs if the Ethernet device operates at 1 Gigabit/s in compliance with EEE standard or the time interval is not more than 20.5 μs if the Ethernet device operates at 100 Megabit/s in compliance with EEE standard. More specifically, the clock generator 100 can recover itself within a time interval (e.g., several micro seconds) no more than the time interval necessary for the device equipped with the clock generator 100 to come alive, and thus the device with the clock generator 100 can easily get back to work in time.

Figure 11:
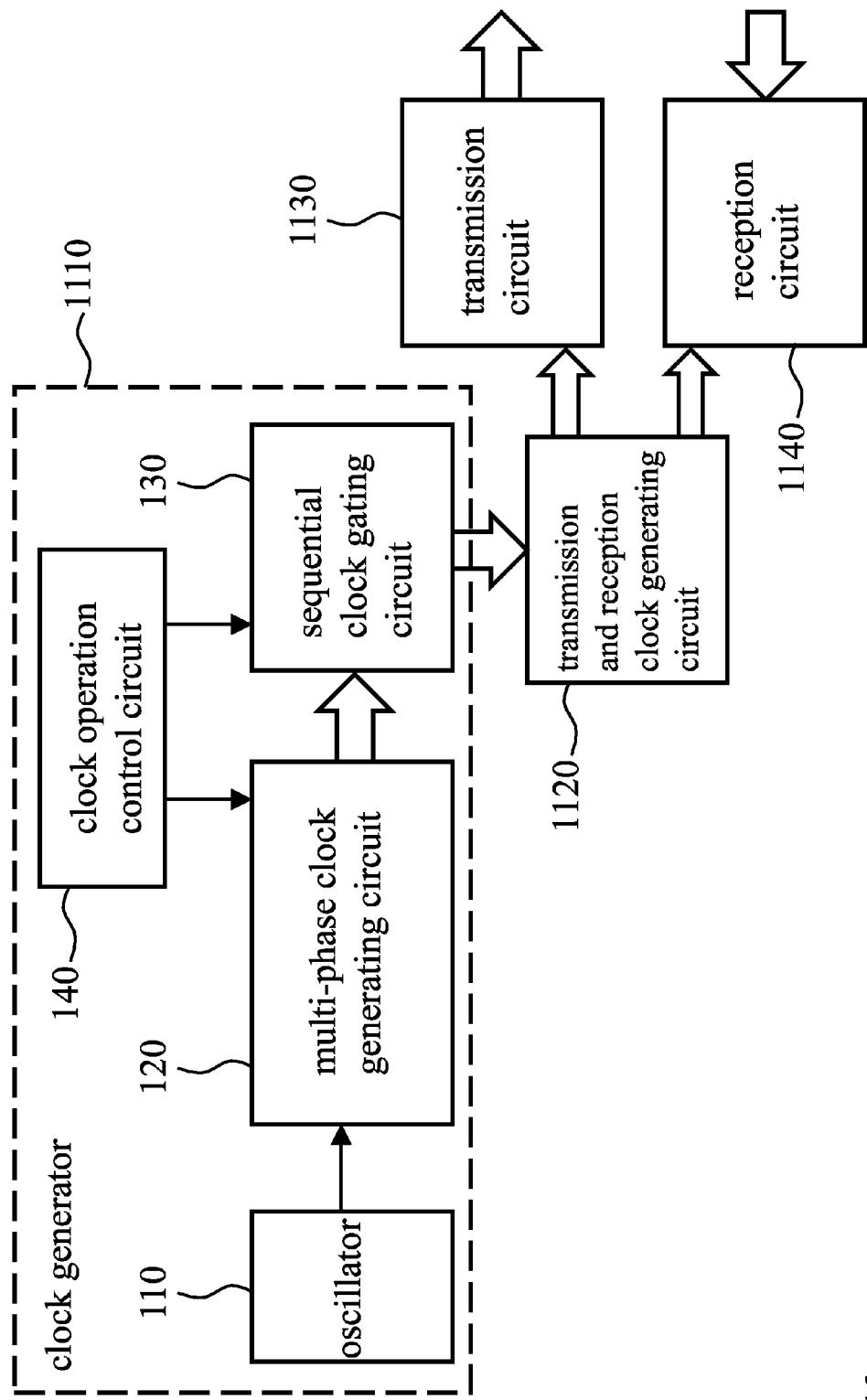
FIG. 11 illustrates an embodiment of the communication device of the present invention.

The present invention also discloses a communication device adopting the aforementioned clock generator and the sequential clock gating circuit therein, and the communication device is capable of temporarily turning off some or all of a multi-phase clock generating circuit after link establishment. As it is shown in FIG. 11, an embodiment of the communication device 10 comprises: a clock generator 1110 operable to generate a plurality of gated clocks; a transmission and reception clock generating circuit 1120, coupled to the clock generator 1110, operable to generate at least one transmission clock and at least one reception clock according to at least one of the gated clocks; a transmission circuit 1130 including one or more transmitting units (not shown) operable to execute at least a transmission operation according to the at least one transmission clock; and a reception circuit 1140 including one or more receiving units (not shown) operable to execute at least a reception operation according to the at least one reception clock.

Figure 12:
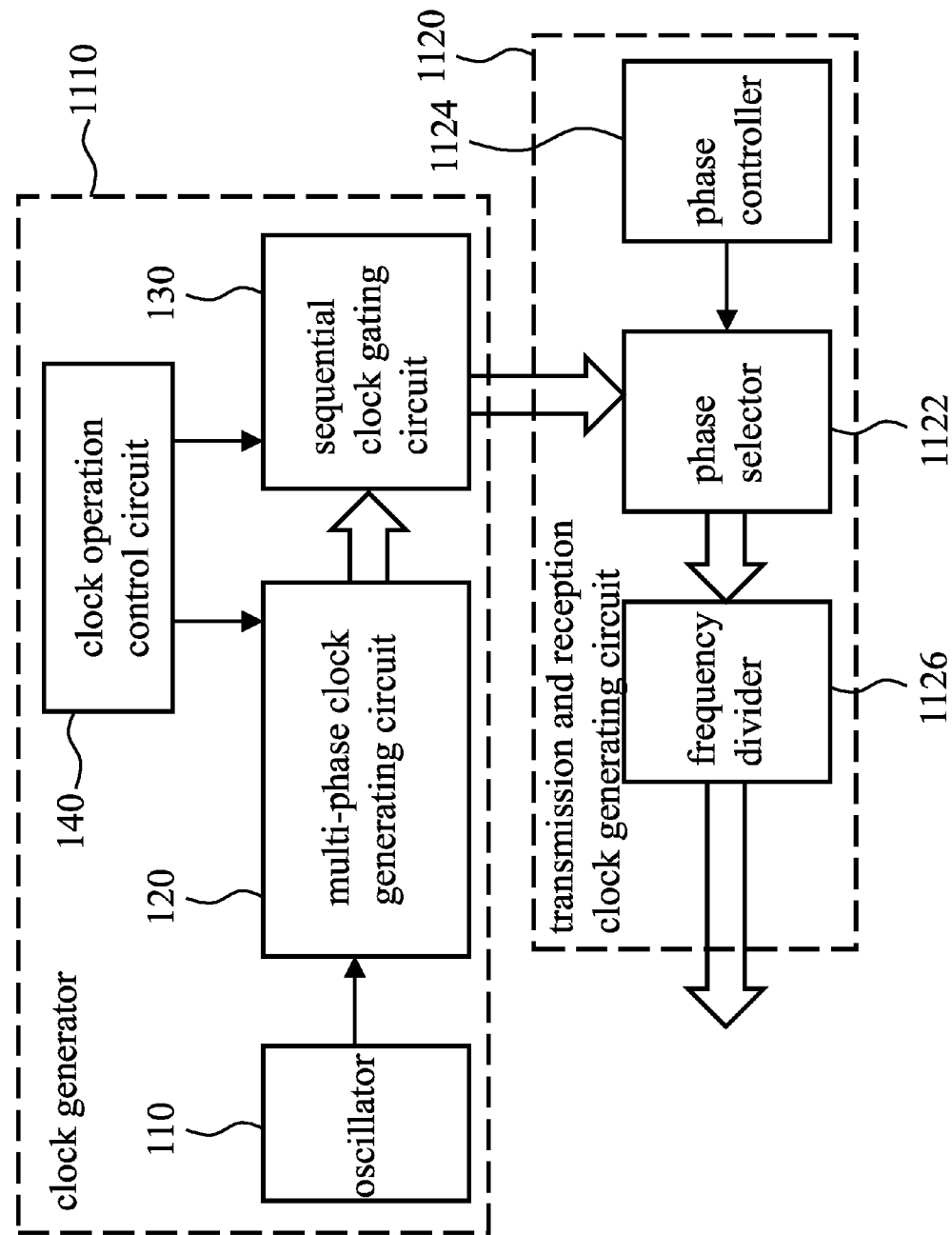
FIG. 12 illustrates an embodiment of the transmission and reception clock generating circuit of FIG. 11.

On the basis of the above, an embodiment of the clock generator 1110 could be the clock generator 100 of FIG. 1, and those of ordinary skill in the art can appreciate the implementation and modification of the clock generator 1110 by referring to the preceding description. An embodiment of the transmission and reception clock generating circuit 1120 is shown in FIG. 12, including: a phase selector 1122, coupled to the sequential clock gating circuit 130, including plural phase selecting units (not shown), each of which is operable to output one of the gated clocks according to a phase control signal; a phase controller 1124 operable to provide the phase control signal according to a timing recovery result; and a frequency divider 1126, coupled to the phase selector 1122, operable to carry out frequency division to the gated clocks from the phase selecting units and thereby generate a plurality of frequency-divided clocks to be the at least one transmission clock and the at least one reception clock in which the phase relation between the frequency-divided clocks is kept controlled after the multi-phase clock generating circuit 120 stopped and then starts outputting the output clocks. This embodiment is applicable when the communication device 10 acts as a master or a slave in communication.

Figure 13:
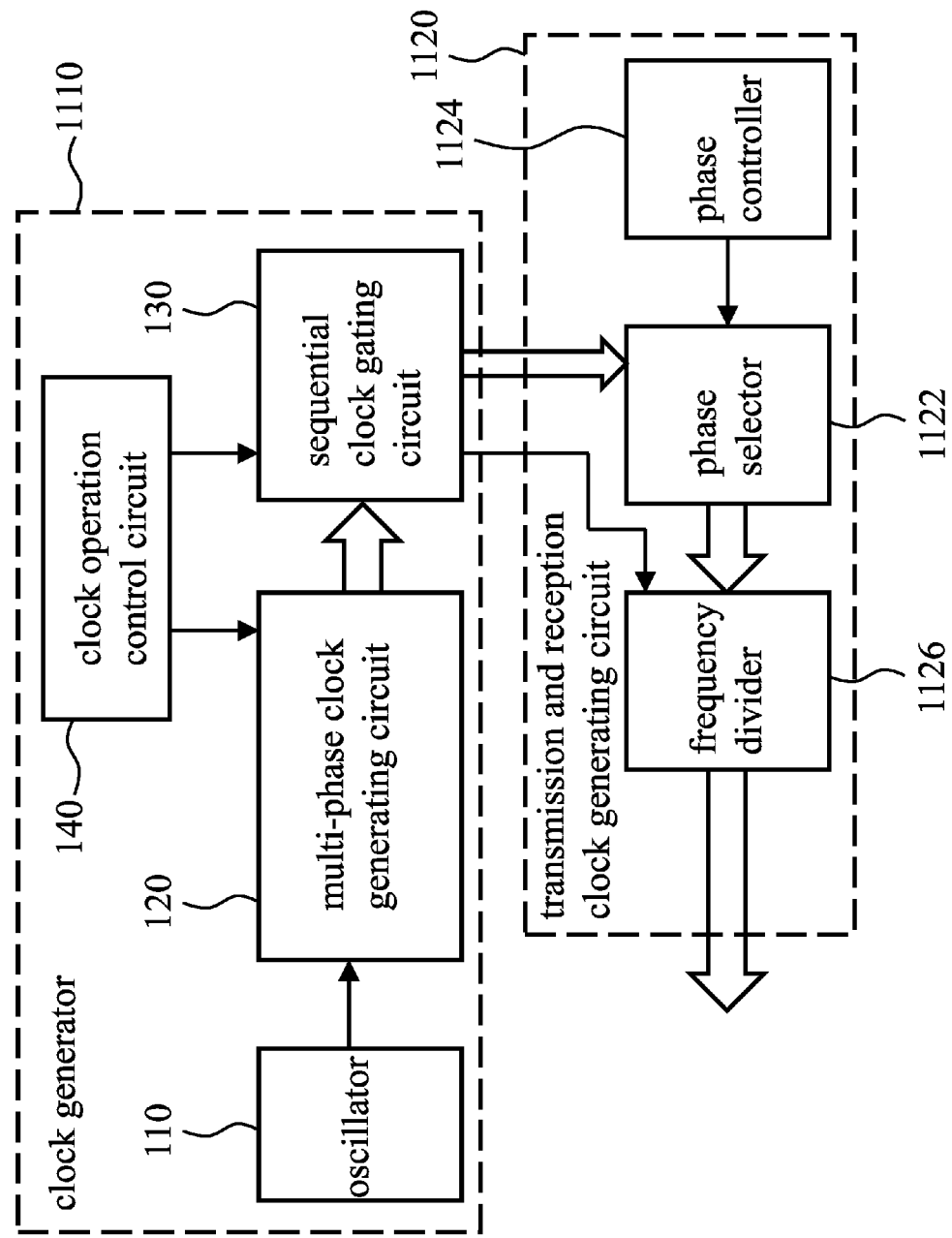
FIG. 13 illustrates another embodiment of the transmission and reception clock generating circuit of FIG. 11.

Another embodiment of the transmission and reception clock generating circuit 1120 is shown in FIG. 13, including: a phase selector 1122, coupled to the sequential clock gating circuit 130, including one or more phase selecting units (not shown), each of which is operable to output one of the gated clocks according to a phase control signal; a phase controller 1124 operable to provide the phase control signal according to a timing recovery result; and a frequency divider 1126, coupled to the phase selector 1122 and the sequential clock gating circuit 130, operable to carry out frequency division to the gated clock(s) from the one or more phase selecting units and to one of the gated clocks from the sequential clock gating circuit 130 instead of the phase selector 1122, and thereby generate a plurality of frequency-divided clocks to be the at least one transmission clock and the at least one reception clock in which the phase relation between the frequency-divided clocks is kept controlled after the multi-phase clock generating circuit 120 stopped and then starts outputting the output clocks.

Figure 14:
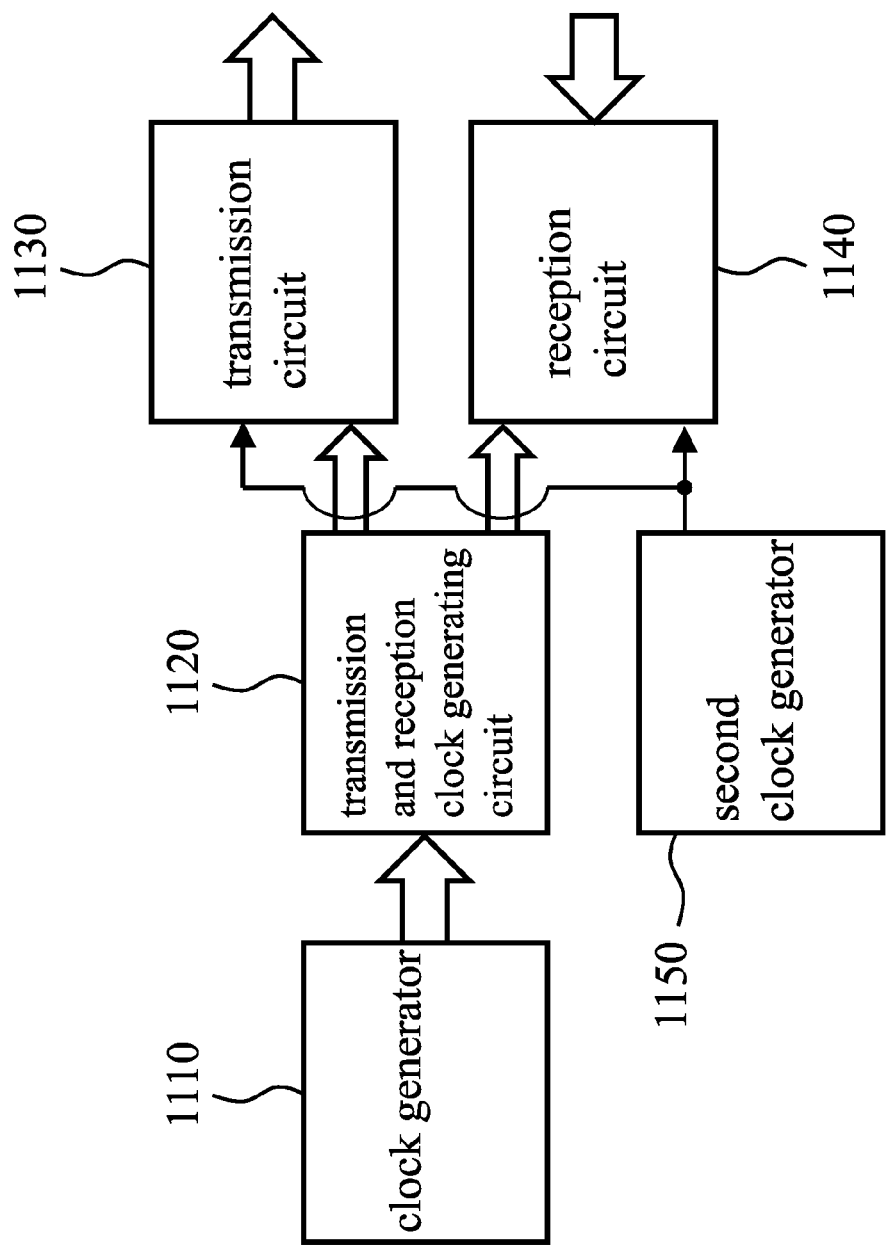
FIG. 14 illustrates an exemplary implementation of the communication device of FIG. 11.
Figure 15:
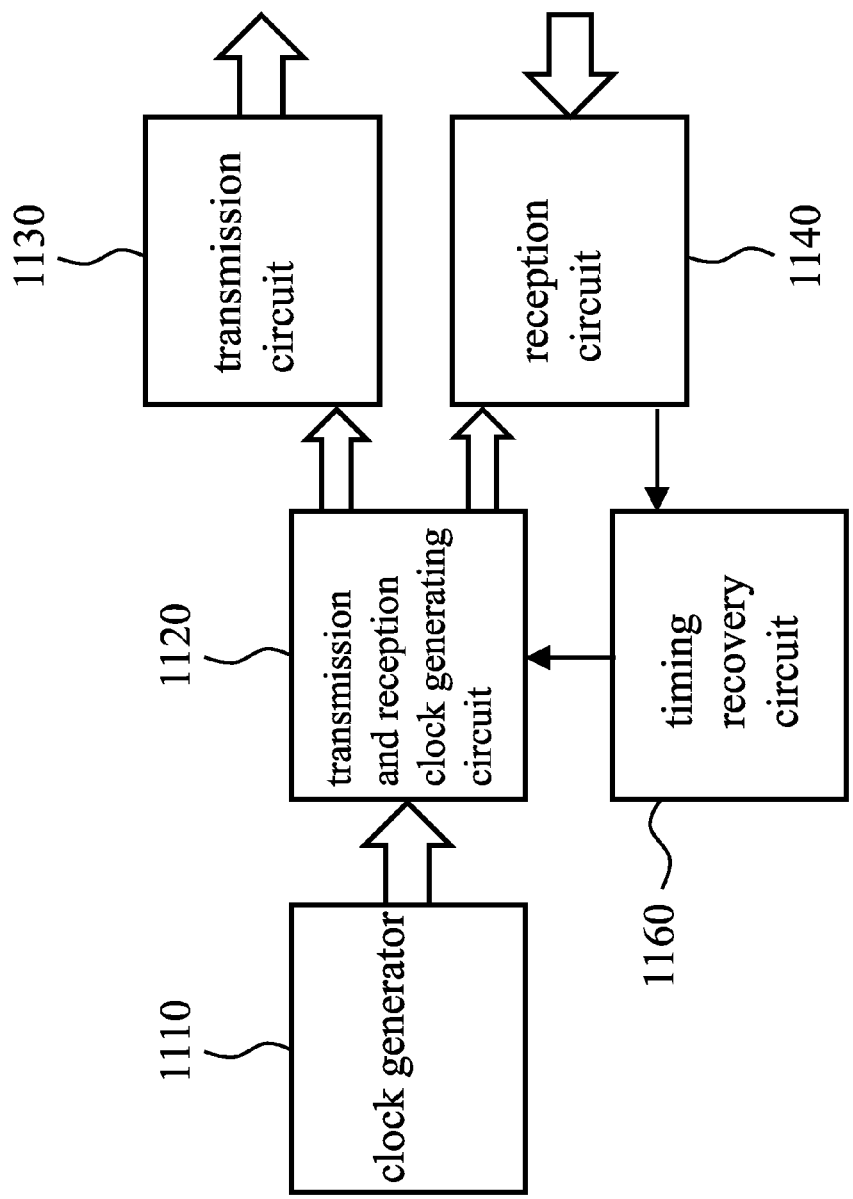
FIG. 15 illustrates another exemplary implementation of the communication device of FIG. 11.

In this embodiment, the communication device 10 is a device such as an Ethernet device supporting 1 Gigabit/s or 100 Megabit/s transmission rate. Therefore, the communication device 10 should output the gated clocks within a predetermined time interval since the communication device 10 receives the power control signal asking the communication device 10 to return to normal (that is to say asking the multi-phase clock generating circuit 120 to start outputting the plural output clocks) in which the predetermined time interval (i.e. the time interval necessary for the communication device 10 to come alive) such as 16.5 µs or 20.5 µs abides by EEE standard and the multi-phase clock generating circuit 120 in the communication device 10 should get ready before the communication device 10 does. However, this communication device 10 is also workable in the communication other than Ethernet communication. Besides, as it is shown in FIG. 14, if the communication device 10 operates under EEE standard, in order to keep some necessary operation of the communication device 10 alive under EEE mode, the communication device 10 may further comprises: a second clock generator 1150 operable to provide at least one second clock for the necessary operation of the communication device 10 (e.g., the operation of some of the transmission and reception circuits 1130, 1140) during the multi-phase clock generating circuit 120 stopping outputting the output clocks in which the power consumption of the second clock generator 1150 is lower than the power consumption of the turned-off part of the multi-phase clock generating circuit 120 and the precision of the second clock could be less than the precision of the gated clocks. In addition, as it is shown in FIG. 15, if the communication device 10 acts as a slave among two link partners, it may further comprises: a timing recovery circuit 1160 operable to provide a timing recovery result for the transmission and reception clock generating circuit 1120 according to a master transmission signal after the multi-phase clock generating circuit 120 stopped and then starts outputting the plurality of output clocks. As a result the transmission and reception clock generating circuit 1120 is operable to choose one of the gated clocks as a fundamental reception clock (e.g., a clock for a pair of wire among four pairs of wire in Ethernet communication) according to the timing recovery result. Because the present invention is able to maintain the relation between transmission and reception clocks for a communication device, the reception and transmission clocks other than the fundamental reception clock can be recovered rapidly in accordance with the clock relation and the said fundamental reception clock. Of course, if the communication device acts as a master, it may also include the timing recovery circuit 1160 to determine a master reception clock according to a slave transmission signal when establishing link.

Since those of ordinary skill in the art can appreciate the detail and modification of this communication device 10 by referring to FIG. 1 through FIG. 10c and the explanation thereof, which means that the embodiments and the features pertaining thereto of the aforementioned clock generator 100 and the sequential clock gating circuit 130 can be applied here in an reasonable way, repeated and redundant description is therefore omitted while the current disclosure is believed to be enough for understanding and enablement. Please note that the invention of Applicant's US application (application number 13793604), hereafter '604 application, can also deal with the problems of restarting a clock generator; however '604 application puts emphasis on generating a calibration signal by referring to a precise reference clock (e.g., the clock of a crystal oscillator) after a phase locked loop restarted, and then outputting the clock of the phase locked loop to a multi-phase clock generator according to the calibration signal, so that the multi-phase clock generator can generate plural output clocks accordingly. The present invention, unlike '604 application, executes gate control over the output clocks of a multi-phase clock generator and thereby outputs gated clocks on the same basis of enablement to ensure the following operation correct. In brief, the two applications solve similar problems in different means.

Please note that each embodiment in this specification includes one or more features; however, this doesn't mean that one carrying out the present invention should make use of all the features of one embodiment at the same time, or should only carry out different embodiments separately. In other words, if an implementation derived from one or more of the embodiments is applicable, a person of ordinary skill in the art can selectively make use of some or all of the features in one embodiment or selectively make use of the combination of some or all features in several embodiments to have the implementation come true, so as to increase the flexibility of carrying out the present invention. Please also note that the terms "first", "second" and the like are used for distinction, and are not limitations in the order, function or claim scope.

In summary, the clock generator, the communication device comprising the clock generator, and the sequential clock gating circuit applied to the clock generator are capable of maintaining an output cycle number relation between gated clocks after a multi-phase clock generating circuit restarts outputting plural output clocks or after the level of a gate control signal has changed for several times, which means that the present invention can prevent clock glitch and the loss of clock relation caused by restarting the multi-phase clock generating circuit. Furthermore, the present invention can make circuits return to a normal state from a power saving state quickly, and is superior to the prior art in power saving efficiency and unsophisticated design.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A clock generator comprising:
   an oscillator operable to generate a reference clock;
   a multi-phase clock generating circuit, coupled to the oscillator, operable to generate a plurality of output clocks according to the reference clock, and operable to stop or start outputting the output clocks according to a power control signal in which the output clocks have the same frequency but different phases;
   a sequential clock gating circuit, coupled to the multi-phase clock generating circuit, operable to sequentially stop or start outputting a plurality of gated clocks according to a gate control signal and the plurality of output clocks, and operable to maintain an output cycle number relation between the gated clocks after the multi-phase clock generating circuit stopped and then starts outputting the output clocks; and
   a clock operation control circuit, coupled to the multi-phase clock generating circuit and the sequential clock gating circuit, operable to provide the power control signal and the gate control signal.

2. The clock generator of claim 1, further comprising:
   a phase selector, coupled to the sequential clock gating circuit, including one or more phase selecting units, each of which is operable to output one of the gated clocks according to a phase control signal; and
   a phase controller operable to provide the phase control signal according to a timing recovery result.

3. The clock generator of claim 2, further comprising:
   a frequency divider, coupled to the phase selector, operable to carry out frequency division according to the gated clocks from the phase selecting units and thereby generate a plurality of frequency-divided clocks in which the phase relation between the frequency-divided clocks is kept controlled after the multi-phase clock generating circuit stopped and then starts outputting the output clocks.

4. The clock generator of claim 2, further comprising:
   a frequency divider, coupled to the phase selector and the sequential clock gating circuit, operable to carry out frequency division according to the gated clock(s) from the one or more phase selecting units and one of the gated clocks from the sequential clock gating circuit instead of the phase selector, so as to generate a plurality of frequency-divided clocks in which the phase relation between the frequency-divided clocks is kept controlled after the multi-phase clock generating circuit stopped and then starts outputting the output clocks.

5. The clock generator of claim 1, wherein the sequential clock gating circuit includes:
   a clock enablement aligning unit, coupled to the clock operation control circuit and the multi-phase clock generating circuit, operable to generate an initial enablement signal according to the gate control signal and one of the output clocks; and
   a plurality of gating units operable to generate the plurality of gated clocks according to the initial enablement signal and the plurality of output clocks.

6. The clock generator of claim 5, wherein the clock enablement aligning unit is operable to make the level of the initial enablement signal reflect an enablement level when the level of the gate control signal is the enablement level and the level of an aligning clock among the output clocks has changed, a first gating unit among the gating units is operable to determine the level of a first gated clock among the gated clocks according to the level of the initial enablement signal or the signal derived therefrom and according to the level of a first clock among the output clocks, and a second gating unit among the gating units is operable to determine the level of a second gated clock among the gated clocks according to the level of the initial enablement signal or the signal derived therefrom and according to the level of a second clock among the output clocks.

7. A communication device capable of temporarily turning off some or all of a multi-phase clock generating circuit after link establishment, comprising:
   a clock generator including:
      an oscillator operable to generate a reference clock;
      the multi-phase clock generating circuit, coupled to the oscillator, operable to generate a plurality of output clocks according to the reference clock, and operable to stop or start outputting the output clocks according to a power control signal in which the output clocks have the same frequency but different phases;
      a sequential clock gating circuit, coupled to the multi-phase clock generating circuit, operable to sequentially stop or start outputting a plurality of gated clocks according to a gate control signal and the plurality of output clocks, and operable to maintain an output cycle number relation between the gated clocks after the multi-phase clock generating circuit stopped and then starts outputting the output clocks; and a clock operation control circuit, coupled to the multi-phase clock generating circuit and the sequential clock gating circuit, operable to provide the power control signal and the gate control signal, a transmission and reception clock generating circuit, coupled to the clock generator, operable to generate at least one transmission clock and at least one reception clock according to at least one of the gated clocks;

a transmission circuit operable to execute at least a transmission operation according to the at least one transmission clock; and a reception circuit operable to execute at least a reception operation according to the at least one reception clock.

8. The communication device of claim 7, wherein the transmission and reception clock generating circuit includes:

a phase selector, coupled to the sequential clock gating circuit, including plural phase selecting units, each of which is operable to output one of the gated clocks according to a phase control signal;

a phase controller operable to provide the phase control signal according to a timing recovery result; and a frequency divider, coupled to the phase selector, operable to carry out frequency division to the gated clocks from the phase selecting units and thereby generate a plurality of frequency-divided clocks to be the at least one transmission clock and the at least one reception clock in which the phase relation between the frequency-divided clocks is kept controlled after the multi-phase clock generating circuit stopped and then starts outputting the output clocks.

9. The communication device of claim 7, wherein the transmission and reception clock generating circuit includes:

a phase selector, coupled to the sequential clock gating circuit, including one or more phase selecting units, each of which is operable to output one of the gated clocks according to a phase control signal;

a phase controller operable to provide the phase control signal according to a timing recovery result; and a frequency divider, coupled to the phase selector and the sequential clock gating circuit, operable to carry out frequency division to the gated clock(s) from the one or more phase selecting units and one of the gated clocks from the sequential clock gating circuit instead of the phase selector, so as to generate a plurality of frequency-divided clocks in which the phase relation between the frequency-divided clocks is kept controlled after the multi-phase clock generating circuit stopped and then starts outputting the output clocks.

10. The communication device of claim 7, wherein the multi-phase clock generating circuit includes:

a phase locked loop, coupled to the oscillator, operable to generate an input clock according to the reference clock and operable to stop or start operating according to the power control signal; and a multi-phase clock generating unit, coupled to the phase locked loop, operable to generate the plurality of output clocks according to the input clock.

11. The communication device of claim 7, wherein the sequential clock gating circuit includes:

a clock enablement aligning unit, coupled to the clock operation control circuit, operable to generate an initial enablement signal according to the gate control signal and one of the output clocks; and a plurality of gating units operable to generate the plurality of gated clocks according to the initial enablement signal and the plurality of output clocks.

12. The communication device of claim 11, wherein the clock enablement aligning unit is operable to make the level of the initial enablement signal reflect an enablement level when the level of the gate control signal is the enablement level and the level of an aligning clock among the output clocks has changed, a first gating unit among the gating units is operable to determine the level of a first gated clock among the gated clocks according to the level of the initial enablement signal or the signal derived therefrom and according to the level of a first clock among the output clocks, and a second gating unit among the gating units is operable to determine the level of a second gated clock among the gated clocks according to the level of the initial enablement signal or the signal derived therefrom and according to the level of a second clock among the output clocks.

13. The communication device of claim 7, further comprising:

a second clock generator operable to provide at least one second clock for the operation of the communication device during the multi-phase clock generating circuit stopping outputting the output clocks, wherein the power consumption of the second clock generator is less than the power consumption of the some or all of the multi-phase clock generating circuit that is turned off.

14. The communication device of claim 7, which is treated as a salve comprising:

a timing recovery circuit operable to provide a timing recovery result for the transmission and reception clock generating circuit according to a master transmission signal after the multi-phase clock generating circuit stopped and then starts outputting the plurality of output clocks, so that the transmission and reception clock generating circuit is operable to generate the at least one reception clock and the at least one transmission clock according to at least one of the gated clocks.

15. A sequential clock gating circuit capable of sequentially stopping and starting outputting a plurality of gated clocks, comprising:

a clock enablement aligning unit operable to generate an initial enablement signal according to a gate control signal and an aligning clock among plural clocks;

a first gating unit, coupled to the clock enablement aligning unit, operable to generate a first gated clock among the gated clocks according to the initial enablement signal or the signal derived therefrom and according to a first clock among the plural clocks; and a second gating unit, coupled to the clock enablement aligning unit, operable to generate a second gated clock among the gated clocks according to the initial enablement signal or the signal derived therefrom and according to a second clock among the plural clocks, wherein the first and second clocks have the same frequency but different phases while an output cycle number relation between the first and second gated clocks is kept controlled after the level of the gate control signal has changed for plural times.

16. The sequential clock gating circuit of claim 15, wherein the clock enablement aligning unit is operable to make the level of the initial enablement signal reflect an enablement level when the level of the gate control signal is the enablement level and the level of the aligning clock has changed, the first gating unit is operable to determine the level of the first gated clock according to the level of the initial enablement signal or the signal derived therefrom and according to the level of the first clock, and the second gating unit is operable to determine the level of the second gated clock according to the level of the initial enablement signal or the signal derived therefrom and according to the level of the second clock.

17. The sequential clock gating circuit of claim 15, wherein the clock enablement aligning unit is a first register, the first gating unit is a first logic gate, and the second gating unit includes:
   a second register operable to generate a derived enablement signal according to the initial enablement signal and the second clock; and
   a second logic gate operable to generate the second gated clock according to the derived enablement signal and the second clock.

18. The sequential clock gating circuit of claim 15, wherein the clock enablement aligning unit is a front-end register, the first gating unit includes:
   a first register operable to generate a first derived enablement signal according to the initial enablement signal and the first clock; and
   a first logic gate operable to generate the first gated clock according to the first derived enablement signal and the first clock,
and the second gating unit includes:
   a second register operable to generate a second derived enablement signal according to the initial enablement signal and the second clock; and
   a second logic gate operable to generate the second gated clock according to the second derived enablement signal and the second clock.

19. The sequential clock gating circuit of claim 15, further comprising:
   a selecting circuit, coupled to the clock enablement aligning unit, operable to output one of the plural clocks as the aligning clock in accordance with a selection signal.

20. The sequential clock gating circuit of claim 15, further comprising:
   a compensation circuit operable to carry out compensation according to the gate control signal and at least one of the first and second clocks, so that a frequency divider is allowed to output a first processed signal and a second processed signal accordingly in which an output cycle number relation between the first and second processed signals is kept controlled after the level of the gate control signal has changed for plural times.

* * * * *